United States Patent
Zuercher et al.

(10) Patent No.: US 8,837,097 B2
(45) Date of Patent: Sep. 16, 2014

(54) PROTECTION, MONITORING OR INDICATION APPARATUS FOR A DIRECT CURRENT ELECTRICAL GENERATING APPARATUS OR A PLURALITY OF STRINGS

(75) Inventors: Joseph C. Zuercher, Brookfield, WI (US); Birger Pahl, Milwaukee, WI (US); Charles J. Luebke, Sussex, WI (US); Brian Thomas Pier, Milwaukee, WI (US); Jerome K. Hastings, Sussex, WI (US); Vijay Bhavaraju, Germantown, WI (US)

(73) Assignee: Eaton Corporation, Cleveland, OH (US)

( * ) Notice: Subject to any disclaimer, the term of this patent is extended or adjusted under 35 U.S.C. 154(b) by 1136 days.

(21) Appl. No.: 12/795,032

(22) Filed: Jun. 7, 2010

(65) Prior Publication Data

US 2011/0301772 A1    Dec. 8, 2011

(51) Int. Cl.
| | |
|---|---|
| *G06F 1/28* | (2006.01) |
| *H01L 31/02* | (2006.01) |
| *H02H 7/20* | (2006.01) |
| *H02H 3/04* | (2006.01) |

(52) U.S. Cl.
CPC . *H02H 7/20* (2013.01); *H02H 3/04* (2013.01); *H01L 31/02021* (2013.01); *Y02E 10/56* (2013.01)
USPC ............................................................ 361/42

(58) Field of Classification Search
USPC .......................................................... 361/42
See application file for complete search history.

(56) References Cited

U.S. PATENT DOCUMENTS

| | | | | |
|---|---|---|---|---|
| 3,947,748 | A * | 3/1976 | Klein ................................ | 363/57 |
| 4,589,401 | A * | 5/1986 | Karim et al. ................... | 123/479 |
| 4,929,884 | A * | 5/1990 | Bird et al. ....................... | 323/313 |
| 6,577,138 | B2 | 6/2003 | Zuercher et al. | |
| 2001/0023703 | A1* | 9/2001 | Kondo et al. ................... | 136/244 |
| 2004/0027749 | A1* | 2/2004 | Zuercher et al. ................ | 361/62 |
| 2005/0213272 | A1* | 9/2005 | Kobayashi ....................... | 361/62 |
| 2006/0162772 | A1* | 7/2006 | Presher et al. ................. | 136/290 |
| 2008/0147335 | A1* | 6/2008 | Adest et al. ...................... | 702/64 |
| 2008/0204950 | A1 | 8/2008 | Zhou et al. | |
| 2009/0207543 | A1* | 8/2009 | Boniface et al. ................ | 361/86 |
| 2010/0043869 | A1* | 2/2010 | Bennett et al. ................ | 136/251 |
| 2010/0149711 | A1* | 6/2010 | Larson et al. ................ | 361/93.1 |

OTHER PUBLICATIONS

National Semiconductor Corporation, "SolarMagic™ power optimizers. Maximizing solar energy for the real world.", SM1230-3A1/4A1/3B1/4B1 Specifications, www.solarmagic.com, 2 pp.

(Continued)

*Primary Examiner* — Jared Fureman
*Assistant Examiner* — Kevin J Comber
(74) *Attorney, Agent, or Firm* — Eckert Seamans Cherin & Mellott, LLC; Kirk D. Houser

(57) ABSTRACT

A protection apparatus is for a direct current electrical generating apparatus. The protection apparatus includes a first terminal; a second terminal; a third terminal; a fourth terminal; at least one current sensor structured to sense current flowing between the first and second terminals or between the third and fourth terminals; a voltage sensor structured to sense a voltage between the first terminal and the third terminal; at least one switch structured to interrupt the current flowing between the first and second terminals or between the third and fourth terminals; and a processor cooperating with the at least one current sensor, the voltage sensor and the at least one switch, and being structured to provide feed forward fault protection for the direct current electrical generating apparatus.

25 Claims, 17 Drawing Sheets

(56) References Cited

OTHER PUBLICATIONS

Tigo Energy, Inc., "Tigo Energy™ Module Maximizer-ES (MM-ES) Data Sheet", 2009, 2 pp.

Solaredge Technology, "SolarEdge Architecture Overview", 2009, 10 pp.

Solaredge Technology, "SolarEdge PowerBox™ Module Add-On Box Solution", 2009, 2 pp.

* cited by examiner

PROTECTION, MONITORING OR INDICATION APPARATUS FOR A DIRECT CURRENT ELECTRICAL GENERATING APPARATUS OR A PLURALITY OF STRINGS

CROSS-REFERENCE TO RELATED APPLICATIONS

This application is related to commonly assigned, copending U.S. patent application Ser. No. 12/582,367, filed Oct. 20, 2009, entitled "STRING AND SYSTEM EMPLOYING DIRECT CURRENT ELECTRICAL GENERATING MODULES AND A NUMBER OF STRING PROTECTORS"; and commonly assigned, copending U.S. patent application Ser. No. 12/637,873, filed Dec. 15, 2009, entitled "DIRECT CURRENT ARC FAULT CIRCUIT INTERRUPTER, DIRECT CURRENT ARC FAULT DETECTOR, NOISE BLANKING CIRCUIT FOR A DIRECT CURRENT ARC FAULT CIRCUIT INTERRUPTER, AND METHOD OF DETECTING ARC FAULTS".

BACKGROUND

1. Field

The disclosed concept pertains generally to array systems and, more particularly, to such array systems including a plurality of direct current electrical generating modules, such as, for example, photovoltaic electrical generating modules. The disclosed concept also pertains to multiple arrays such as string arrays, including a number of strings having a plurality of direct current electrical generating modules. The disclosed concept further pertains to direct current electrical generating modules and, more particularly, to photovoltaic (PV) modules and detectors and protectors therefor.

2. Background Information

It is known to employ several parallel strings of series-connected direct current (DC) electrical generating modules (e.g., without limitation, PV generating modules) with a protective device located in the positive conductor of each string. This protective device is a fuse and only protects against a reverse over current when the corresponding string shorts and is back fed by the other PV strings which are bussed together at a main DC bus in a combiner box.

In PV generating modules, bypass diodes across cells limit fault voltage, typically to about 11 VDC (for 18 cells) for a polysilicon technology, thereby preventing sustained series arcing internal to the module. However, an open failure of any bypass diode can produce a series arc itself (as it opens), as well as remove the 11 VDC limitation across the cells in parallel with the diode.

PV generating modules themselves typically can achieve voltages from about 35% to about 70% of open circuit voltage, generally in a range that can drive a continuous series arc (in fact, recent developments describe modules with voltages that reach 120 VDC). Thus, a butt joint or an interconnect break within a module shorted at its terminals can produce an internal arc with maximum available power approaching rated power.

Parallel shorts and arcs can have varying available voltages from relatively very low to bus level, depending on their location. A fuse-protected string (typically with reverse current protection of about 8 A) can remain intact (un-blown) for a parallel pinch fault of about two-times rated current at a voltage on the order of about one-third to one-half of the bus voltage (feed). Half the current is sourced from the remote modules, and the other half is sourced from the feed modules. An improvement is a blocking diode that prevents any reverse current, although reliability is a concern here. However, modules which can be switched open through local detection of a string fault could supplement the function of a blocking diode or fuse.

An intermediate case is that of a junction box terminal short or arc. Here the voltage is limited to the module voltage, and the fault current can be viewed as being the difference between the string current and the module current, which is often less than rated current, depending on the fault voltage. On the other hand, if this type of fault is contained within the box itself, local heating (watts) can be higher.

Another type of fault is arcing or leakage to the module frame or other grounded metal. A fuse may exist from the ground system to the neutral (typically about 1 A), which may limit the ground fault current. However, if the fault can be cleared before the fuse blows, the fuse could remain intact as a backup for future incidents.

There is room for improvement in strings.

There is also room for improvement in protection, monitoring or indication apparatus for a direct current electrical generating apparatus.

There is further room for improvement in protection apparatus for a plurality of strings.

SUMMARY

These needs and others are met by embodiments of the disclosed concept, which can provide indication, monitoring and/or fault protection for arcing, over currents, ground faults, reverse feed faults, feed forward faults and/or control for DC circuits used, for example, in photovoltaic (PV) systems, such as PV electric power generation systems.

In accordance with one aspect of the disclosed concept, a protection apparatus for a direct current electrical generating apparatus comprises: a first terminal; a second terminal; a third terminal; a fourth terminal; at least one current sensor structured to sense current flowing between the first and second terminals or between the third and fourth terminals; a voltage sensor structured to sense a voltage between the first terminal and the third terminal; at least one switch structured to interrupt the current flowing between the first and second terminals or between the third and fourth terminals; a processor cooperating with the at least one current sensor, the voltage sensor and the at least one switch, and being structured to provide feed forward fault protection for the direct current electrical generating apparatus.

As another aspect of the disclosed concept, an indication apparatus for a direct current electrical generating apparatus comprises: a first terminal; a second terminal; a third terminal; a fourth terminal; at least one current sensor structured to sense current flowing between the first and second terminals or between the third and fourth terminals; a voltage sensor structured to sense voltage between the first and third terminals; at least one indicator; and a processor cooperating with the at least one current sensor, the voltage sensor and the at least one indicator, and being structured to detect a fault event internal to or external to the indication apparatus and indicate a corresponding internal fault state or external fault state on the at least one indicator.

As another aspect of the disclosed concept, a protection apparatus for a plurality of strings comprises: a plurality of inputs, each of the plurality of inputs being for one of the plurality of strings; a plurality of outputs, each of the plurality of outputs being for one of the plurality of strings; a plurality of current sensors, each of the plurality of current sensors being structured to sense current flowing between a corresponding pair of one of the plurality of inputs and one of the plurality of outputs; a switch electrically connected between a first node electrically connected to the plurality of outputs and a second node; and a processor cooperating with the plurality of current sensors and the switch, and being structured to provide at least one of over current protection, arc fault protection, reverse current protection and feed forward protection for an array formed by the plurality of strings.

As another aspect of the disclosed concept, a protection apparatus for a direct current electrical generating apparatus comprises: a first terminal; a second terminal; a third terminal; a fourth terminal; at least one current sensor structured to sense current flowing between the first and second terminals or between the third and fourth terminals; at least one switch structured to interrupt the current flowing between the first and second terminals or between the third and fourth terminals; a processor cooperating with the at least one current sensor and the at least one switch, and being structured to provide fault protection for the direct current electrical generating apparatus; and at least one input structured to define one of a first off state to cause the processor to open the at least one switch and a second on state to cause the processor to close the at least one switch.

As another aspect of the disclosed concept, a monitoring apparatus for a direct current electrical generating apparatus comprises: a first terminal; a second terminal; a third terminal; a fourth terminal; a voltage sensor structured to sense a voltage between the first terminal and the third terminal; at least one current sensor structured to sense current flowing between the first and second terminals or between the third and fourth terminals; an indicator; and a processor cooperating with the voltage sensor, the at least one current sensor and the indicator, and being structured to provide at least one of: (i) determine if the sensed voltage is less than a predetermined percentage of a rated open circuit voltage and responsively cause the indicator to indicate a short or an overcurrent fault for the direct current electrical generating apparatus, (ii) determine a feed forward fault and responsively cause the indicator to indicate the feed forward fault for the direct current electrical generating apparatus, (iii) determine a reverse current fault and responsively cause the indicator to indicate the reverse current fault for the direct current electrical generating apparatus, (iv) determine an open circuit fault and responsively cause the indicator to indicate the open circuit fault for the direct current electrical generating apparatus, (v) determine an arc fault and responsively cause the indicator to indicate the arc fault for the direct current electrical generating apparatus, and (vi) determine a ground fault and responsively cause the indicator to indicate the ground fault for the direct current electrical generating apparatus, wherein the at least one current sensor is two current sensors to sense first current flowing between the first and second terminals and second current flowing between the third and fourth terminals.

As another aspect of the disclosed concept, a monitoring apparatus for a direct current electrical generating apparatus comprises: a first terminal; a second terminal; a third terminal; a fourth terminal; a switch electrically connected between the second terminal and the fourth terminal; a voltage sensor structured to sense a voltage between the first terminal and the third terminal; a current sensor structured to sense a current flowing between the first terminal and the second terminal or between the third terminal and the fourth terminal; an indicator; and a processor cooperating with the voltage sensor, the current sensor, the indicator and the switch, and being structured to provide at least one of: (i) determining if the sensed voltage is less than a first predetermined percentage of a rated open circuit voltage and responsively causing the indicator to indicate a short or an overcurrent fault for the direct current electrical generating apparatus; (ii) temporarily closing the switch, measuring a short circuit current from the sensed current, and opening the switch; and (iii) determining if the sensed current is greater than a second predetermined value.

As another aspect of the disclosed concept, a protection apparatus for a direct current electrical generating apparatus comprises: a first terminal; a second terminal; a third terminal; a fourth terminal; a first switch electrically connected between the first terminal and the second terminal or between the third terminal and the fourth terminal; a second switch electrically connected between the second terminal and the fourth terminal; a voltage sensor structured to sense a voltage between the first terminal and the third terminal; a current sensor structured to sense a current flowing between the first terminal and the second terminal or between the third terminal and the fourth terminal; an indicator; and a processor cooperating with the voltage sensor, the current sensor, the indicator, the first switch and the second switch, and being structured to: (i) determine if the sensed voltage is less than a first predetermined percentage of a rated open circuit voltage and responsively cause the indicator to indicate a short or an overcurrent fault for the direct current electrical generating apparatus; (ii) temporarily close the second switch, measure a short circuit current from the sensed current, and open the second switch; (iii) determine if the sensed current is greater than a second predetermined value; and (iv) provide non-ground fault protection for the direct current electrical generating apparatus.

As another aspect of the disclosed concept, a string comprises: a plurality of direct current electrical generating apparatus; and for each of the plurality of direct current electrical generating apparatus, a protection apparatus comprising: a first terminal; a second terminal; a third terminal; a fourth terminal; at least one current sensor structured to sense current flowing between the first and second terminals or between the third and fourth terminals; at least one switch structured to interrupt the current flowing between the first and second terminals or between the third and fourth terminals; and a processor cooperating with the at least one current sensor and the at least one switch, and being structured to provide fault protection for a corresponding one of the plurality of direct current electrical generating apparatus, wherein the first terminal and the third terminal are electrically connected to the corresponding one of the plurality of direct current electrical generating apparatus, wherein the second terminal and the fourth terminal form portions of the string from a feed end to a remote end thereof, wherein the second terminal of the protection apparatus at the feed end of the string forms a power bus, wherein the fourth terminal of the protection apparatus at the remote end of the string forms a return bus, and wherein the at least one switch of the protection apparatus at the remote end of the string interrupts current flowing between the third and fourth terminals.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
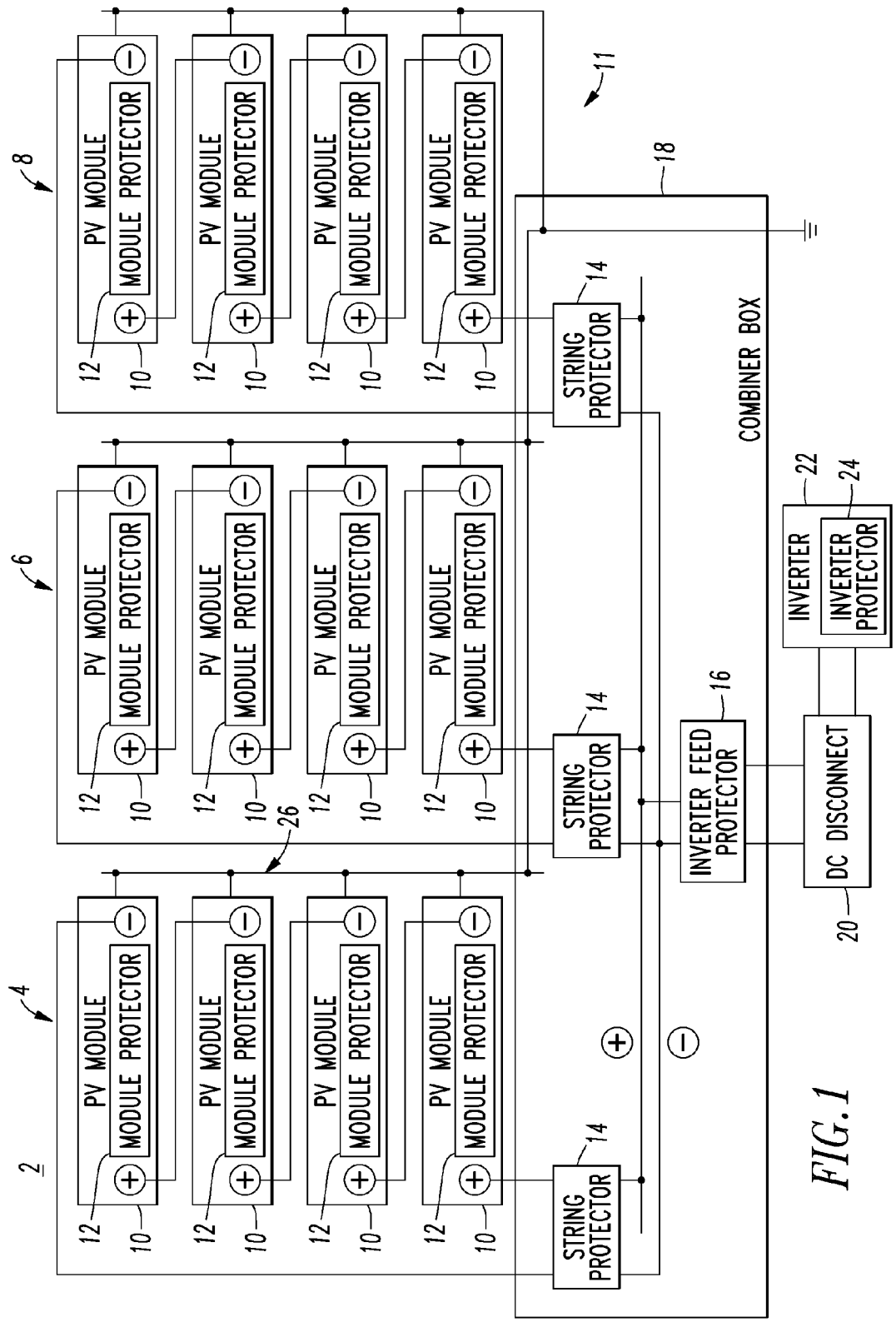
FIG. 1 is a block diagram of a system including a plurality of strings of direct current (DC) electrical generating modules, a plurality of module protectors, a plurality of string protectors, an inverter feed protector and an inverter protector in accordance with embodiments of the disclosed concept.

As employed herein, the term "number" shall mean one or an integer greater than one (i.e., a plurality).

As employed herein, the term "processor" means a preprogrammed, programmable or dedicated logic analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the term "short circuit" means a bolted fault or an arcing fault to the opposite polarity or to ground.

As employed herein, the term "bolted fault" means a solid or direct or suitably low impedance electrical connection to the opposite polarity or to ground, typically resulting in an increase in current flow.

As employed herein, the term "arcing fault to the opposite polarity" means an electrical connection to the opposite polarity through a conductive plasma. For example and without limitation, such arcing faults can include: (1) a metal vapor arc (or spark); (2) a plasma arc that requires a relatively hot ionized conduction path; and (3) arcing over a surface which has suffered from a deterioration of its insulating capability by way of an electrolyte or carbon tracking.

As employed herein, the term "in-circuit arcing fault" or "in-circuit arc" means a sustained arcing break (e.g., a plasma) in series electrical connection(s), internal to a generating module, between plural generating modules, or in electrical circuits running to or from a combiner box or any other electrical junction(s), terminal(s) or connection(s). Here, series means that there is another circuit element (e.g., an inverter) present that prevents the arc from being directly in parallel with the generating module.

As employed herein, the term "open circuit" means a break without arcing in a series circuit electrical connection of a string.

As employed herein, the terms "arc fault circuit interrupter", "AFCI" and "arc fault protector" mean an arc fault detector and a number of DC switches responsive to the arc fault detector.

As employed herein, the term "string" means a series electrical circuit connection of a plurality of electrical generating modules.

As employed herein, the term "string protector" means a protection device for a string and/or an electrical generating module of a string. The string protector includes a number of AFCI, over current, reverse current, feed forward fault and/or ground fault protection functions.

As employed herein, the term "combiner box" means a box, an enclosure or another suitable structure where one end of a plurality of strings are fused and/or protected. A combiner box electrically combines in parallel DC currents from several strings.

As employed herein, the term "direct current electrical generating module" means a photovoltaic electrical generating module, a battery or a fuel cell.

As employed herein, the term "power line" generally refers to a power conductor at the feed end of a string or between PV modules.

As employed herein, the term "return line" generally refers to a power conductor extending from the remote end to the feed end of a string.

As employed herein, the term "feed forward fault" means a fault defined by a non-zero forward current and a corresponding voltage that is significantly lower than Voc (e.g., without limitation, a voltage less than about 20% of open circuit voltage) or Vmpp (voltage at the maximum power point). For example, a feed forward fault can indicate an external short toward the feed (inverter) end of a string.

A photovoltaic string of generating modules is an example of a series circuit electrical connection of a plurality of electrical generating modules. An "in-circuit arc" can occur, for example, when an electrical circuit, comprised of a series circuit electrical connection of a plurality of generating modules, is opened under load creating an arc across a gap that sustains the arc.

A "short circuit arc" can occur, for example, when an alternative (e.g., a change from the "normal" conduction path (e.g., from the return conductor at the inverter, through all the generating modules, to the feed conductor, and back to the inverter)) short circuit path to the opposite polarity or ground is established.

A short circuit can, for example and without limitation, form an alternative and un-wanted electrical path that a conventional protection function cannot detect or protect for currents taking an alternative path, such that excessive currents can cause overheating and arcs can cause fires.

An alternative short circuit path (e.g., such as the above un-wanted electrical path) can result in over currents due to back feed currents from adjacent strings to the short circuit path.

A short circuit path can be established at any point along series-connected electrical generating modules.

A short circuit path can also be established between the return or feed conductors from several strings routed in a common location or raceway, or to a grounded frame, conduit, or conductor.

The disclosed concept is described in association with protection for photovoltaic (PV) circuits, although the disclosed concept is applicable to a wide range of DC applications, including for example and without limitation, relatively higher DC voltage circuits, such as wind power, hybrid vehicles, electric vehicles, marine systems and aircraft.

The disclosed concept is described in association with strings including a plurality of photovoltaic electrical generating modules, although the disclosed concept is applicable to strings and string arrays including a plurality of direct current electrical generating modules (DC EGMs) and to DC EGMs.

Protection is accomplished by a current sensor on either or both of the positive and negative conductors of the string or DC EGM. The personality of the current waveform can be interrogated by looking at the DC current and the broadband high frequency current (up to, but not limited to, about 100 kHz) to determine if there is an arcing event, if there is a short circuit (or over current) event, if there is a ground fault event, or if there is a reverse current or feed forward fault event. Arc fault and short circuit (or over current) events can be determined by suitable current wave form attributes. By providing an arc fault trip in response to the detection of an arc in power conductors accomplishes fire protection, which is not provided in known PV systems.

The balance between the inflow and outflow of PV module current determines the presence of a module ground fault. A trip on the detection of ground current provides fire prevention and an electrocution safety function.

Communication between PV modules, string combiner boxes, a remote location, and the enabling of AC power inverters or utilities can be accomplished by power line encoding to reduce wiring. Alternatively, a separate cable (e.g., without limitation, such as is employed by common communication systems) can also accomplish communication.

A remote control function permits ON/OFF operation under programmed automatic trip control and can be responsive to a manual override. A manual override enables service (e.g., without limitation, allowing a maintenance person to approach the PV modules, strings or combiner boxes knowing the potential has been disconnected, thereby achieving electrocution safety).

The disclosed concept is discussed in connection with PV electric power generation systems, although it can be applied to a wide range of DC systems operating at voltages high enough to be considered dangerous. For example, the International Electro-technical Committee (IEC) (a global standards organization), UL and NEMA (North American safety and application standards bodies) have established 60 VDC as the dangerous level.

The remote control function allows fire and emergency people to disconnect the high voltage and make it safe to execute emergency procedures in a building with a PV array. This is a comprehensive safety system for PV arrays used in homes, commercial businesses, or utilities.

The disclosed PV system provides circuit safety functions, customarily found in AC distribution systems and as required by building codes. The disclosed PV system preferably includes no unprotected circuits (e.g., 600 VDC).

The disclosed concept is discussed in connection with PV electric power generation systems, although it can be applied to a wide range of DC systems operating at voltages high enough to be considered dangerous. For example, the International Electro-technical Committee (IEC), UL and NEMA have established 60 VDC as a dangerous level.

Referring to FIG. 1, a power system 2 includes a plurality of strings 4,6,8 of direct current (DC) electrical generating modules (shown as photovoltaic (PV) modules 10) that form an array 11, a plurality of module protectors 12, a plurality of string protectors 14, an inverter feed protector 16 located in a combiner box 18, a DC disconnect 20, and an inverter 22 including an inverter protector 24. The example module protectors 12 can provide arc fault protection, ground fault protection, reverse current protection, overcurrent protection, feed forward fault protection, diagnostics and/or communications as will be discussed, below, in connection with FIGS. 2A, 2B, 3A, 3B, 5-7 and 13B. The example string protectors 14 can provide arc fault protection, ground fault protection, reverse current protection, overcurrent protection, feed forward fault protection, diagnostics and/or communications. The example inverter feed protector 16 can provide arc fault protection, ground fault protection, reverse current protection, overcurrent protection, feed forward fault protection, diagnostics, and/or remote communications. The example inverter protector 24 can provide arc fault protection, ground fault protection, reverse current protection, overcurrent protection, feed forward fault protection, diagnostics, and/or remote communications. One or both of the PV modules 10 and the combiner box 18 can include a number of DC/DC converters for a PV module or for the strings 4,6,8, respectively. The protectors 12,14,16 can also be for one of the DC/DC converters.

Figure 2A:
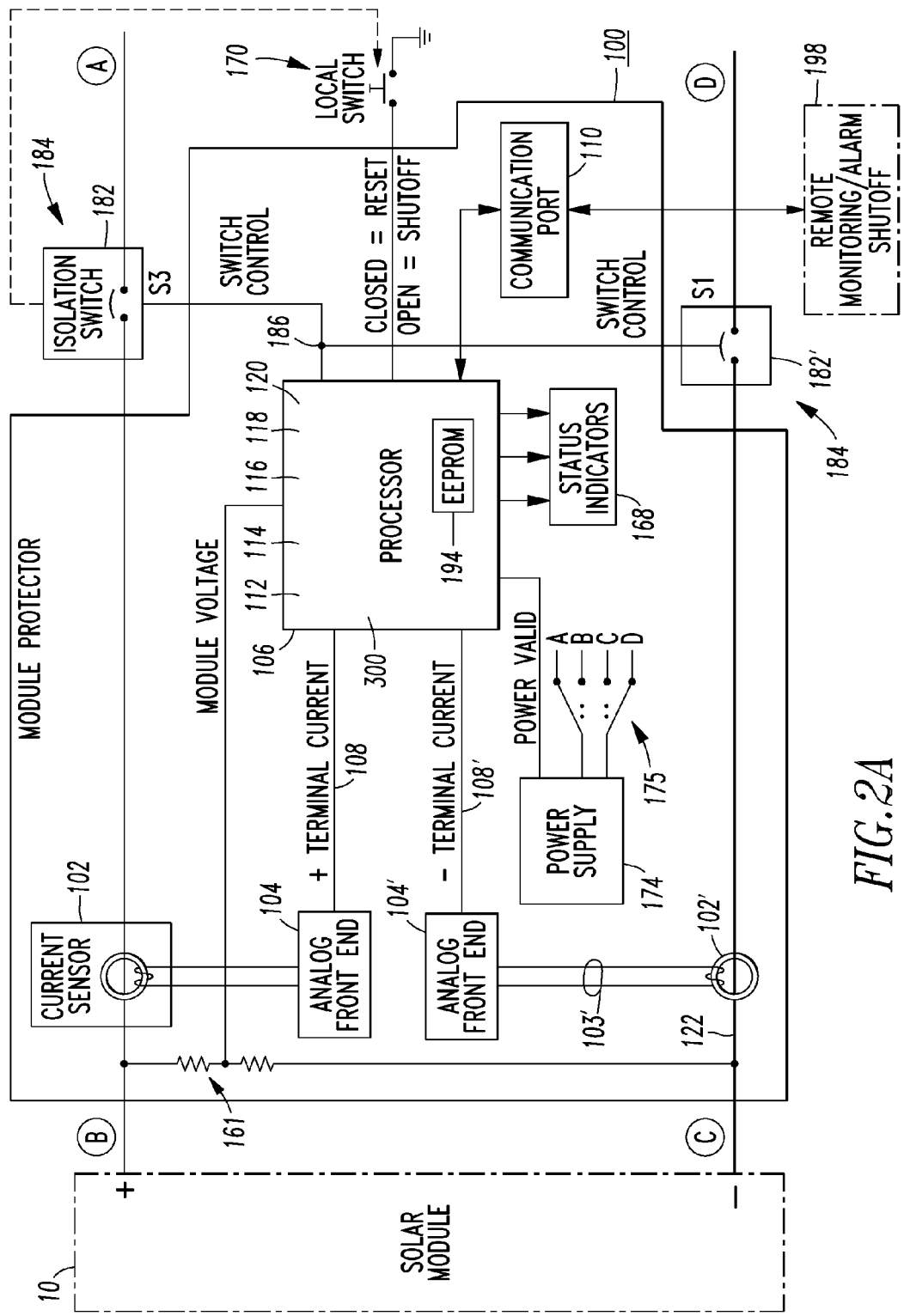
FIGS. 2A and 2B are block diagrams of solar or photovoltaic (PV) module protectors in accordance with embodiments of the disclosed concept.

FIG. 2A shows a protector with an external circuit interrupter 184 (e.g., without limitation, mechanically slaved double pole switch S1/S3 and local auxiliary switch 170). The circuit interrupter 184 can be manually controlled, even without module protector power present.

Figure 2B:
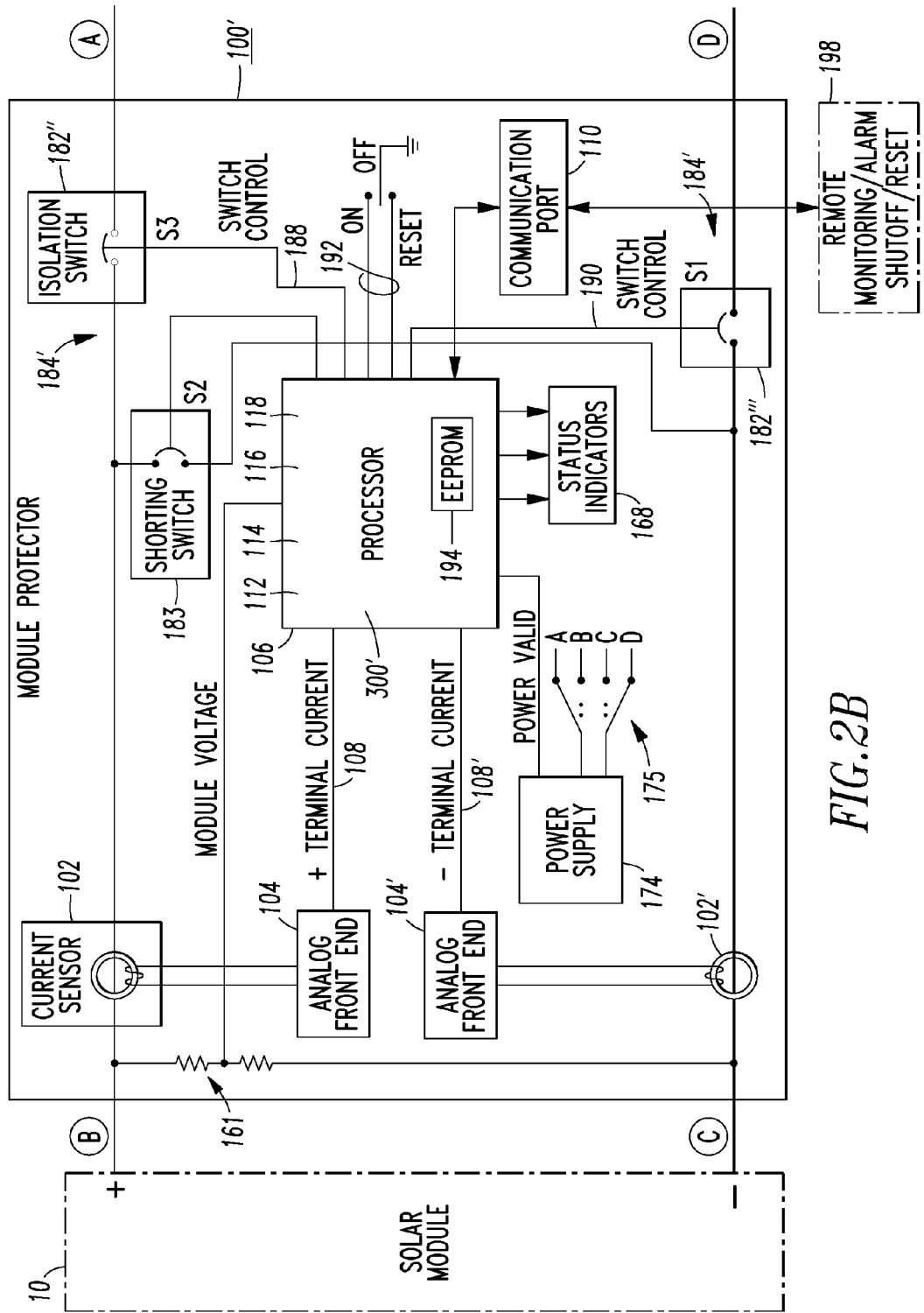

FIG. 2B shows an internal disconnect that independently controls S1 and S3 via either internally generated control or externally through manual operation of a switch input 192, either of which employs circuit protector power.

Referring to FIG. 2A, a relatively more detailed version of the module protector 12 is shown by an example module protector (MP) 100. The MP 100 includes two example current sensors 102,102', two analog front ends 104,104' and a processor 106 (e.g., without limitation, microprocessor) that monitors the sensed +terminal current 108 and sensed −terminal current 108' and reports the same (e.g., without limitation, through communication port 110). The processor 106 includes an over current protector routine 112, an arc fault protector routine 114, a reverse current protector routine 116, a ground fault protector routine 118, and a feed forward protector routine 120, which is discussed below in connection with FIG. 13B.

A non-limiting example of DC over current detection and protection for the routine 112 is interrupting the DC power circuit when one or both of the sensed +terminal current 108 and sensed −terminal current 108' exceed a predetermined current value or according to a suitable trip-time curve.

Non-limiting examples of DC arc fault detection and protection for the routine 114 are disclosed by U.S. Pat. No. 6,577,138 and U.S. patent application Ser. No. 12/637,873, which are incorporated by reference herein.

A non-limiting example of DC reverse current detection and protection for the routine 116 is interrupting the DC power circuit when one or both of the sensed +terminal current 108 and sensed −terminal current 108' exceed a predetermined negative current value or according to a suitable trip-time curve.

For DC ground fault protection, the second example current sensor 102' is placed on the second module conductor 122 and the current sensor secondary 103' is electrically connected to the analog front end 104' to provide the sensed module return current 108' to processor 106 for use by the ground fault protector routine 118. The routine 118 calculates the difference between the +terminal current 108 and the −terminal current 108' to determine if a residual or ground fault current is present.

The example isolation switches (S3 and S1) 182,182' in FIG. 2A can open both the positive bus (e.g., between terminals B and A) and also the negative bus (e.g., between terminals C and D). S1 and S3 are typically two poles within a single device, with 170 being a local auxiliary switch. Isolation switches 182" and 182'" can be independent switches in FIG. 2B.

The example MP 100 also includes a number of local status indicators 168, such as LEDs, to locally indicate alarms or fault states. The communication port 110 can report a fault state or health of the corresponding solar module 10 to a remote location, such as 198 (shown in phantom line drawing). The remote location 198 can be structured to determine fault location based on which of various MPs 12 (FIG. 1), such as MP 100 (FIG. 2A), reported a fault state or did not report corresponding module heath. The remote location 198 can also command shutoff of the MP 100. If the MP 100 detects a fault (e.g., without limitation, arc fault; ground fault) regardless of fault location, it opens the power circuit with isolation switches S1,S3. Preferably, local status indicators 168 can be employed to quickly locate the fault location. Alternatively, or in addition, this function can be provided by remote monitoring/notification to the remote location 198.

The example MP 100 includes a power supply 174 that can receive power from an external power supply (e.g., switch 175 at positions A and D), from a main bus (not shown) (switch 175 at positions A and D) and/or from a corresponding local DC EGM, such as solar module 10 (switch 175 at positions B and C).

The example MP 100 is structured to measure currents (I) through the current sensors 102,102' and voltage (V) generated by the solar module 10 through the divider 161. Illumination can be indirectly estimated by knowing the module voltage and current characteristics as is discussed, below, in connection with FIGS. 13A-13C.

The isolation switches S1 and/or S3 are preferably implemented by a manually operated, one or two-pole shunt trip circuit interrupter 184 (e.g., without limitation, circuit breaker; DC disconnect) with a shunt trip coil (not shown) actuated by switch control 186 to open. The isolation switches S1 and S3 are manually reclosed by an operator at the circuit interrupter 184.

The MP 100' of FIG. 2B is somewhat similar to the MP 100 of FIG. 2A. In FIG. 2B, the isolation switches 182" (S3) and 182'" (S1) can be part of a local, electronically controlled relay 184' (to open or close) and there is also a shorting switch 183 (S2). The isolation switches 182",182'" function like a relay and can be electronically controlled on and off. Preferably, these isolation switches 182",182'" are independently controlled by separate switch control signals 188,190. A local switch input 192 has the following states: on, off, and reset, as will be explained. The last fault state of MP 100 is retained in EEPROM 194, in order that on power up (302' of FIG. 3B), the processor 106 can determine the initial state for the isolation switches 182",182'" and the indicators 168, as will be discussed, below, in connection with FIG. 3B. Extra sensors and switches can also be employed for enhanced (active) diagnostic features, as will also be discussed in connection with FIG. 3B. Also, (passive) diagnostic features can be provided, as are further discussed in connection with FIGS. 3A and 3B.

A safe maintenance mode for MP 100' can be provided with the local switch input 192 (on, off, reset) for FIG. 2B, and by manual operation of the isolation switches S1,S3 for FIG. 2A.

The MPs 100,100' of FIGS. 2A and 2B can also be employed as a string protector 14 or inverter feed protector 16 as located at the combiner box 18 (FIG. 1) to perform the same protection and diagnostic functions at a string level, or can be located at the array DC disconnect 20 (FIG. 1) or inverter protector 24 (FIG. 1) to perform the same protection and diagnostic functions at a subarray/array level. However, the advantage of performing those functions at the level of the PV or solar module 10 (FIGS. 1, 2A and 2B) is the relatively fine granularity for detecting, isolating and locating a fault while keeping the maximum amount of the array formed by the strings 4,6,8 (FIG. 1) producing DC power. The advantage of performing those functions at the string or array level is lower cost (e.g., fewer module protectors), but with less granularity for isolating and locating a fault.

If only one of the switches S1 and S3 and only one of the current sensors 102 and 102' are employed by the MPs 100, 100' of FIGS. 2A and 2B, then the single current sensor and the single switch can either be employed in the same conductor (e.g., S3 and 102, or S1 and 102') or can be employed in opposite conductors (e.g., S1 and 102, or S3 and 102').

Figure 3A:
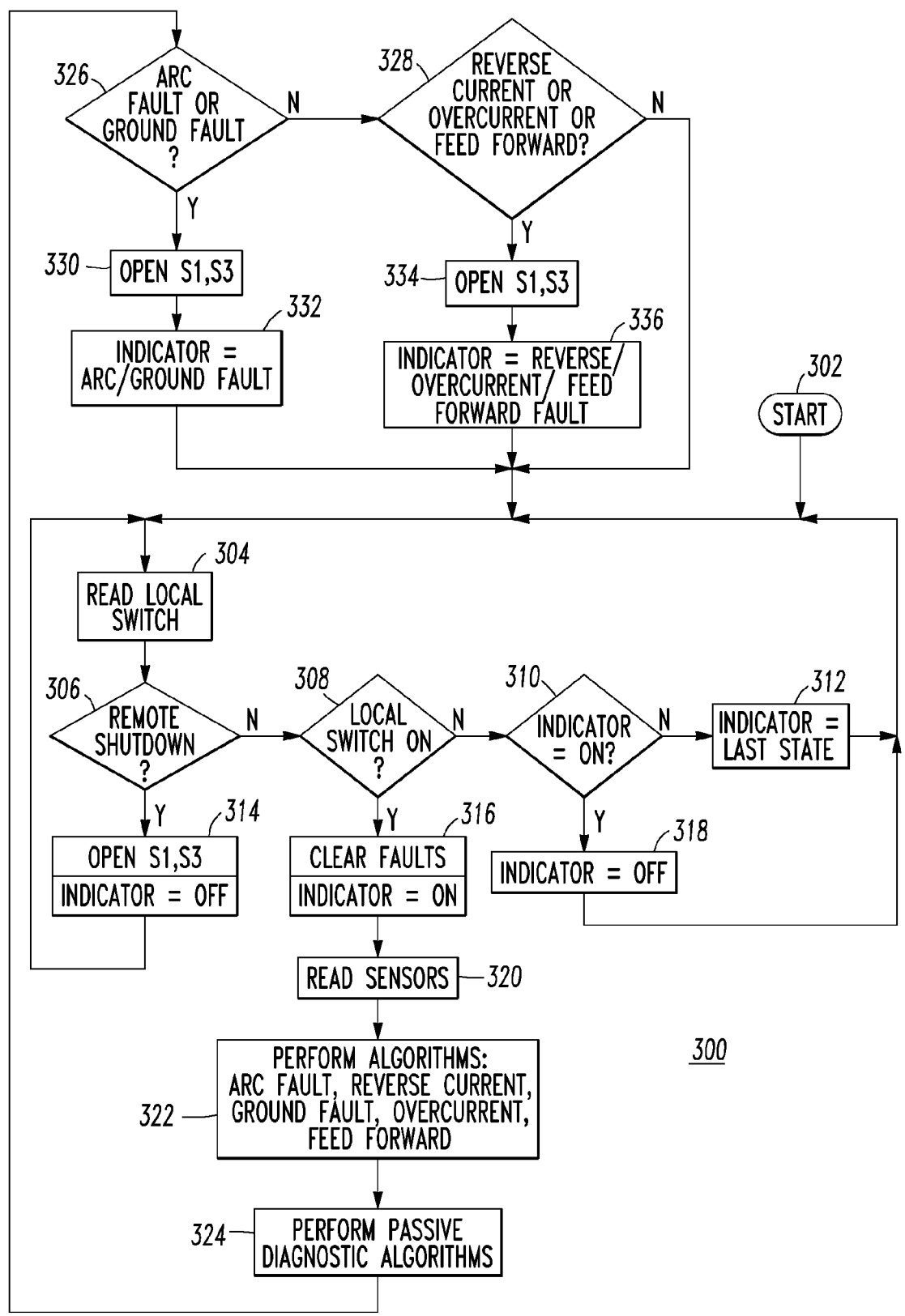
FIGS. 3A and 3B are flowcharts for the processors of FIGS. 2A and 2B, respectively.
Figure 3B:
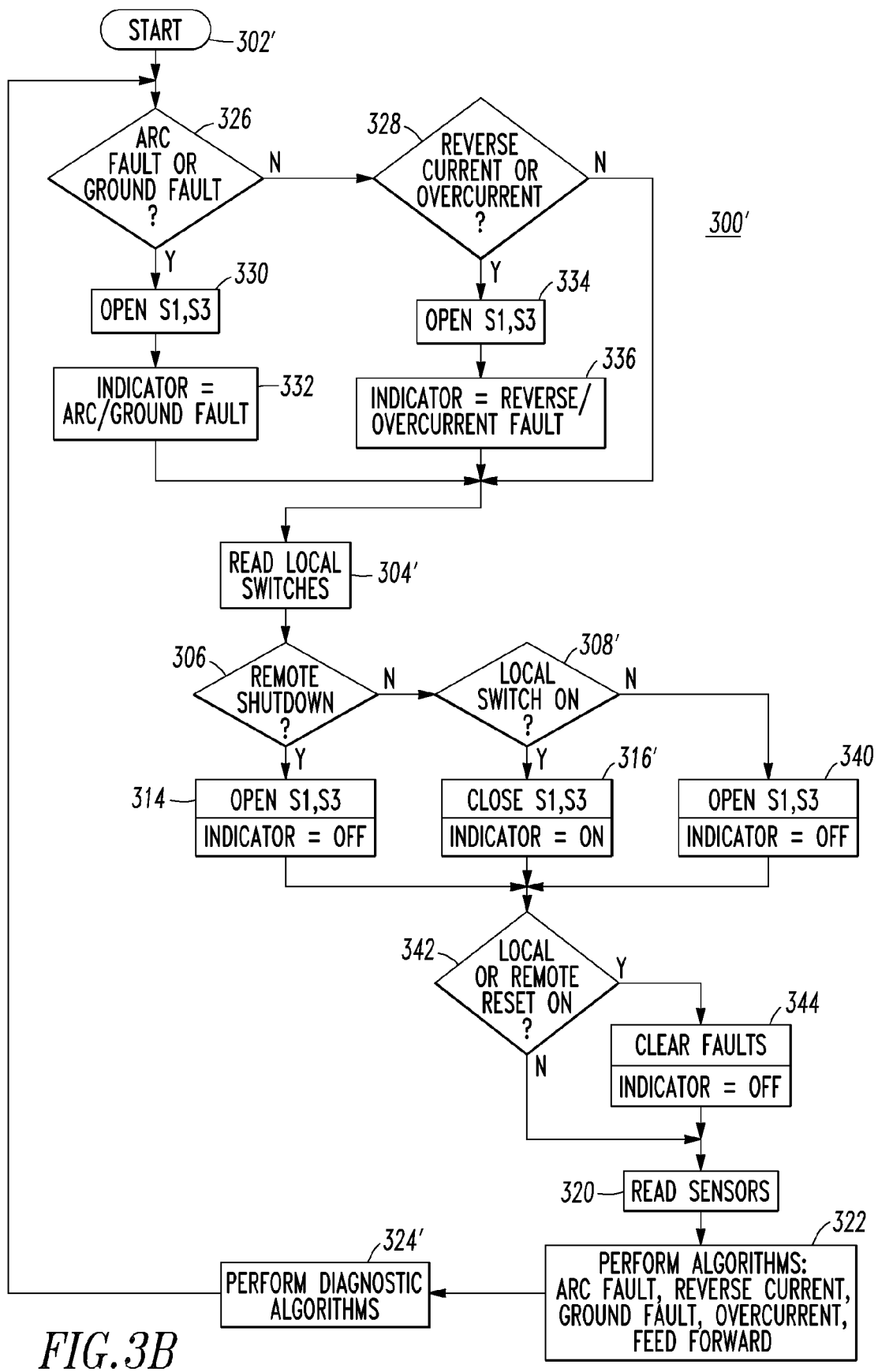

The routines 300 and 300' of FIGS. 3A and 3B are somewhat similar (the same portions include identical reference characters), but are different in the areas of the local switch inputs 170,192, the last known state of the MP 100,100', and the logic sequence to determine the state for the isolation switches 182,182' or 182",182'", the indicators 168, and the shorting switch 183 (FIG. 2B). In FIG. 2A, the local switch 170 is the state of the isolation switches 182,182', which can be electronically opened via the switch control (shunt trip) signal 186, manually opened, and manually closed. The indicators 168 reflect the last state of the MP 100, even though there was a power loss (e.g., which would occur overnight). Whenever the state of the local status indicators 168 is changed, a communication message can also be sent remotely by communication port 110 to report the status/state.

In FIG. 3A, the routine 300 starts at 302 and, then, reads the local switch 170 of FIG. 2A at 304. A manual reset of the external circuit interrupter 184 is employed to reclose the isolation switches 182,182' of FIG. 2A. The local switch 170 is an auxiliary switch (not shown) of the circuit interrupter 184 that reflects the state of the isolation switches 182,182'. This local switch 170 is read first, at 304. Later, at 312, the fault state in EEPROM 194 is read to determine the initial value of the status indicators 168. After 304, at 306, a remote shutdown is determined by checking for a corresponding message from the communication port 110. If no remote shutdown was requested, then at 308, it is determined if the local switch 170 is "on" (e.g., closed, which indicates that there was a reset). Otherwise, if the local switch 170 is "off" (e.g., open, which calls for a shutoff because the isolation switches 182,182' were manually turned off for maintenance or service), then it is determined if a "power" indicator (not shown) of the status indicators 168 is "on". If not, then, at 312, the status indicators 168 are set to their last state from EEPROM 194 before step 304 is repeated.

If a remote shutdown was requested at 306, then the isolation switches S1,S3 are opened and the "power" indicator and the other status indicators 168 are turned off, at 314, before step 304 is repeated. If the local switch 170 is "on" at 308, then faults are cleared and the "power" indicator is turned on, at 316, before step 320 is executed. If the "power" indicator is "on" at 310, then the "power" indicator and the other status indicators 168 are turned off, at 318, before step 304 is repeated. Otherwise, since the local switch 170 is "off" (shut-off), the status indicators 168 remain in their last state at 312. This allows the intended fault to still be shown until the isolation switches 182,182' are manually closed (reset), and the local switch 170 is set on (reset).

After step 316, at 320, the various current and voltage sensors 102,102',161 are read. Next, at 322, the over current protector routine 112, the arc fault protector routine 114, the reverse current protector routine 116, the ground fault protector routine 118 and the feed forward fault protector routine 120 are executed. Then, at 324, passive diagnostic algorithms are executed as will be discussed. Next, at 326, it is determined if there was an arc fault or a ground fault. If not, then, at 328, it is determined if there was a reverse current, an overcurrent or a feed forward fault. If a fault was detected at 326 or 328, then the isolation switches 182,182' are opened at 330 or 334, and the status indicators 168 are set to the corresponding state at 332 or 336, respectively. After 332 or 336, execution resumes at 304.

In FIG. 3A, the passive diagnostic algorithms 324 do not require temporarily (actively) opening the isolation switches S1,S3 or closing the shorting switch S2 to measure a parameter with a sensor reading. The passive diagnostic algorithms 324 can be performed by the MP 100 of FIG. 2A or as part of the diagnostic algorithms 324' of FIG. 3B for the MP 100' of FIG. 2B.

For example and without limitation, if the voltage sensor 161 senses a voltage V1 (FIG. 13B) that is less than about 20% of rated V_oc (open circuit voltage as will be discussed) and Iop (operational current)>I1 (FIG. 13B), then a feed forward fault (external short) is detected. This short can be considered to be an overcurrent fault (e.g., open isolation switches S1,S3 at 334, and set the indicator to overcurrent fault at 336).

If both the current and the voltage remain at or about zero, then an internal fault to the module or string can be detected. This condition can be caused either by an internal short or by an internal open of the module or string.

As an alternative in FIGS. 3A and 3B, a ground fault may be alarm only (e.g., the indicator is set to ground fault at 332, but the isolation switches S1,S3 remain closed). This is typically done for ungrounded (floating) PV arrays.

In FIG. 3B, the diagnostic algorithms 324' include active diagnostic algorithms and optionally include the passive diagnostic algorithms 324 of FIG. 3A, and employ temporary, active opening of the isolation switches S1,S3 and/or temporary, active closing of the shorting switch S2 to measure a corresponding parameter with a sensor reading. These active diagnostic algorithms are performed in FIG. 3B where the isolation switches S1,S3 can be controlled (opened and closed), unlike FIG. 3A where the isolation switches S1,S3 can only be actively opened (but not closed). The active diagnostic algorithms are run periodically or upon manual (local or remote) request after the five fault algorithms at 322 of FIG. 3B, such that opening/closing of the isolation switches S1,S3 and shorting switch S2 should not interfere with detecting the five fault types, or interrupt power production/delivery for any significant amount of time.

The active diagnostic algorithms include three tests. First, measure operational current, Iop, close shorting switch S2, measure short circuit current, I_sc, open shorting switch S2, and if Iop is less than a predetermined percentage of I_sc (e.g., without limitation, 50% of I_sc), then a reduced power condition is detected or, in the case of the operating current being suitably close to zero, an external open circuit is detected and the status indicators 168 are set to an external fault. Optionally, since there is an external fault, a separate, dedicated indicator of the status indicators 168 can be employed for that purpose, or, alternatively, the power on indicator can be flashed to show that power is available, but not being delivered. Second, measure operational voltage, Vop, open the isolation switches S1,S3, measure open circuit voltage, V_oc, and close the isolation switches S1,S3. If Vop<V1 (FIG. 13B) (e.g., without limitation, V1=0.2*V_oc) and Iop>I1 (FIG. 13B), then a feed forward fault (external short circuit) is detected, and the status indicators 168 are set to an external fault. Third, perform calculations to determine the temperature and illumination that satisfy the four parameters, Vop, V_oc, Iop and I_sc, and the characteristics in FIGS. 13A and 13C. From this, a revised maximum power point (MPP) may be calculated, V_mpp(T) and I_mpp(ILL), from the reference maximum power point, V_mpp_ref and I_mpp_ref, so that performance can be determined based on the location of the operating parameters, Vop and Iop, relative to this revised MPP (defined by an MPP region 1326 of FIG. 13B).

In FIGS. 3A and 3B, indicator off or indicator on refers to the status indicators 168, which include, for example and without limitation, power, arc/ground fault, and reverse/overcurrent/feed forward fault. At most, only one of these three example indicators is on at a time. If the isolation switches S1,S3 are closed, then the power indicator is on.

In FIGS. 3A and 3B, if the isolation switches S1,S3 are open and there is no fault (e.g., shunt trip circuit interrupter 184 of FIG. 2A is manually opened; local switch 170 is off=open=shutoff in FIG. 2A; local switch input 192 is reset in FIG. 2B; a remote reset is requested via the communication port 110), then all of the status indicators 168 are off. If there is an arc fault or a ground fault, then the isolation switches S1,S3 are open, and the arc/ground fault indicator is on. If there is a reverse current or overcurrent or feed forward fault, then the isolation switches S1,S3 are open and the reverse/overcurrent/feed forward fault indicator is on. A separate indicator of the status indicators 168 for a feed forward fault (in addition to an indicator of the status indicators 168 for a reverse/overcurrent fault) can distinguish the direction of an external short fault. Detecting a reverse/overcurrent fault is the result of a short towards the remote end of a string relative to the protector, whereas detecting a feed forward fault is the result of a short towards the feed end of the string relative to the protector.

The routine 300' of FIG. 3B is somewhat similar to the routine 300 of FIG. 3A, except that steps 302', 304', 308', 316' and 324' are different than respective steps 302, 304, 316 and 324 of FIG. 3A. The start 302' of FIG. 3B is just prior to the test at 326, a different local switch input 192 is read by step 304', step 308' is the same as step 308, but has two different branches to 316' and 340, step 316' closes the isolation switches S1,S3 and turns on the power indicator 168 rather than clearing the faults, and step 324' performs both passive and active diagnostics. Also, steps 340, 342 and 344 are added. If the local switch input 192 is not on at 308', then, at 340, the isolation switches S1,S3 are opened, and the power indicator 168 is turned off. After 316' or 314 or 340, it is determined if either a local or remote reset is active. If so, then at 344, the faults are cleared and the status indicators 168 are turned off. Otherwise, or after 344, at 320, the sensors are read at 320.

Figure 4A:
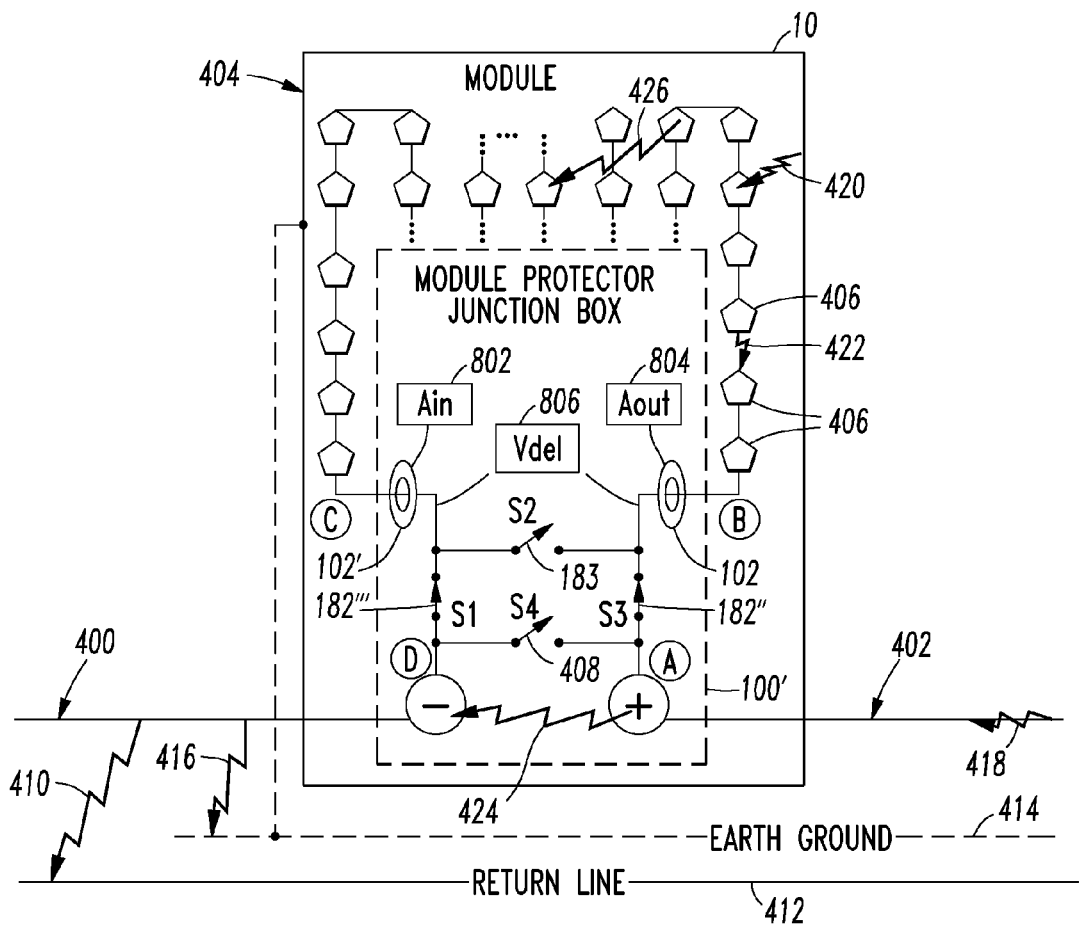
FIG. 4A is a simplified block diagram of a PV module and the PV module protector of FIG. 2B showing the positions of switches and sensors in accordance with another embodiment of the disclosed concept.
Figure 4B:
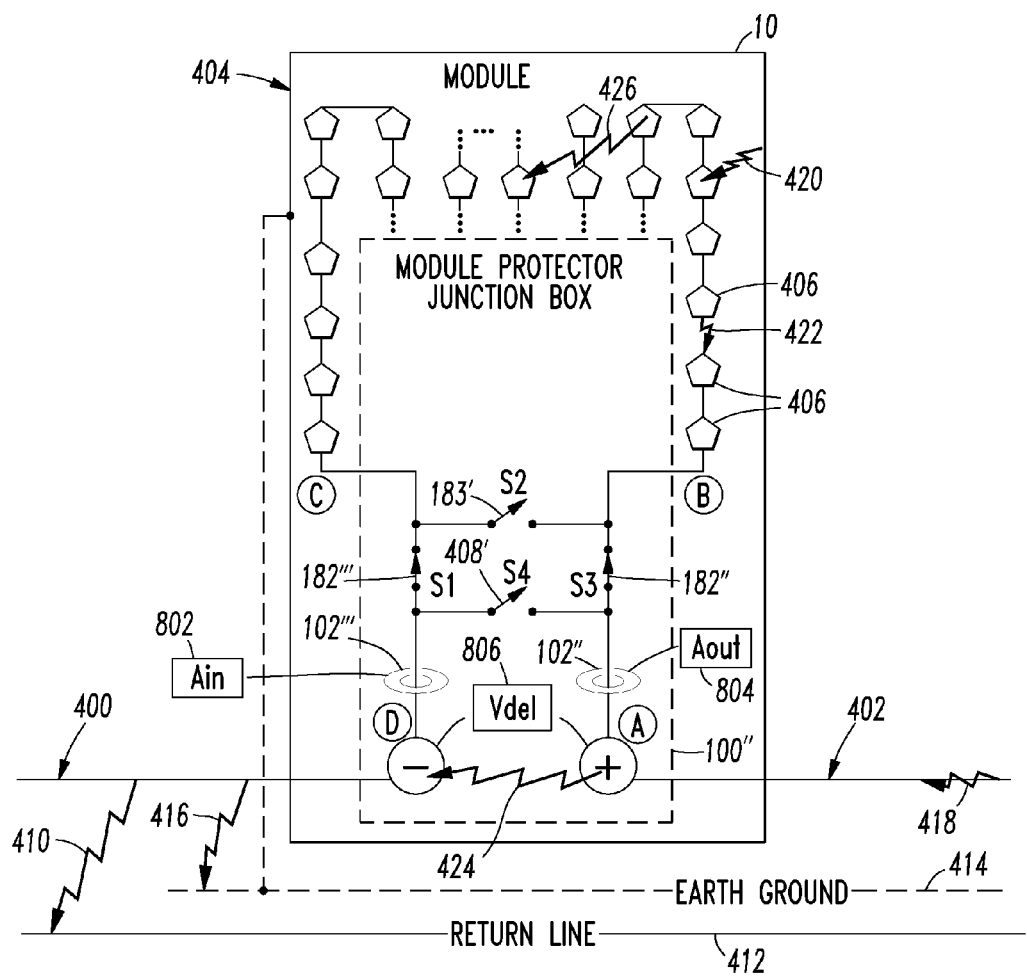
FIG. 4B is a simplified block diagram of a PV module and another PV module protector showing the positions of switches and sensors in accordance with another embodiment of the disclosed concept.

FIGS. 4A and 4B show the solar module 10 with module protectors 100' of FIG. 2B and module protector 100", respectively. In FIGS. 4A and 4B, 400 is an external power line (e.g., without limitation, 200 VDC, 7 A) from the "−" terminal to the next solar module (not shown) toward the remote end (not shown) of a string (not shown), and 402 is an external power line (e.g., without limitation, 200 VDC, 7 A) from the "+" terminal to the next solar module (not shown) toward the feed end (not shown) of the string. The solar module 10 includes a conductive metal frame 404 and a plurality of cells 406. Although not shown in FIG. 2B, an optional second shorting switch 408 (S4) can be provided across the positive ("+") and negative ("−") terminals.

In this configuration, there are various possible internal and external faults including an external power line 400 to return line 412 fault 410, an external power line 400 to ground 414 fault 416, an external in circuit fault 418, an internal power line to ground 414 fault 420, an internal in circuit fault 422, an external junction box terminal short (beyond the internal current sensors 102,102') fault 424, and an internal cell short fault 426.

In FIG. 4B, MP 100" is similar to MP 100', except that current sensors 102",102'" and voltage sensor (not shown) are installed between the switches S1-S4 (isolation switches 182",182'" and shorting switches 183',408') and the positive ("+") and negative ("−") terminals. Here, any faults in the switches are sensed as being internal to the MP 100"; however, any diagnostics involving measurement of I_sc are not possible.

Figure 5:
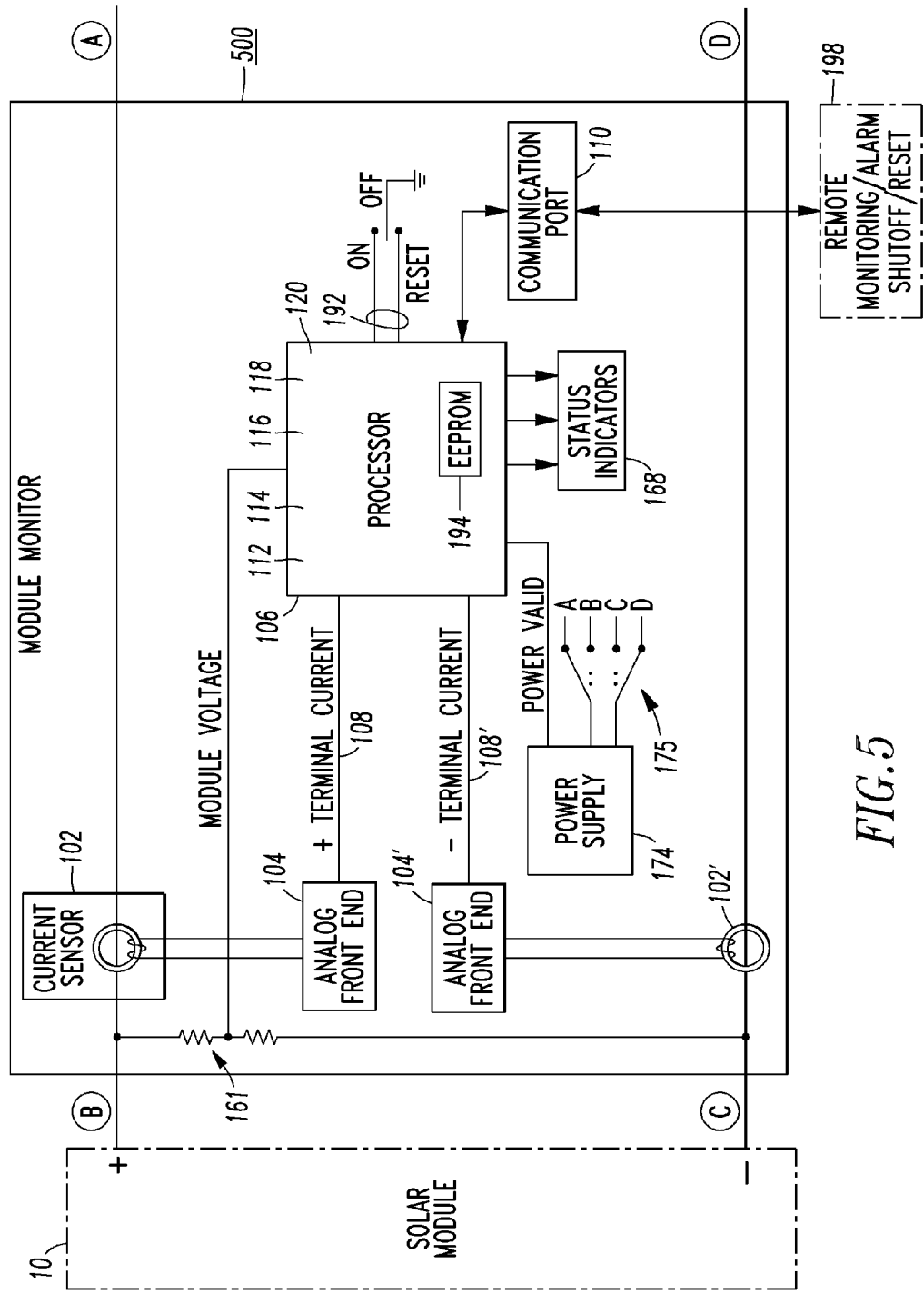
FIGS. 5-7 are block diagrams of solar or photovoltaic (PV) module protectors in accordance with other embodiments of the disclosed concept.
Figure 6:
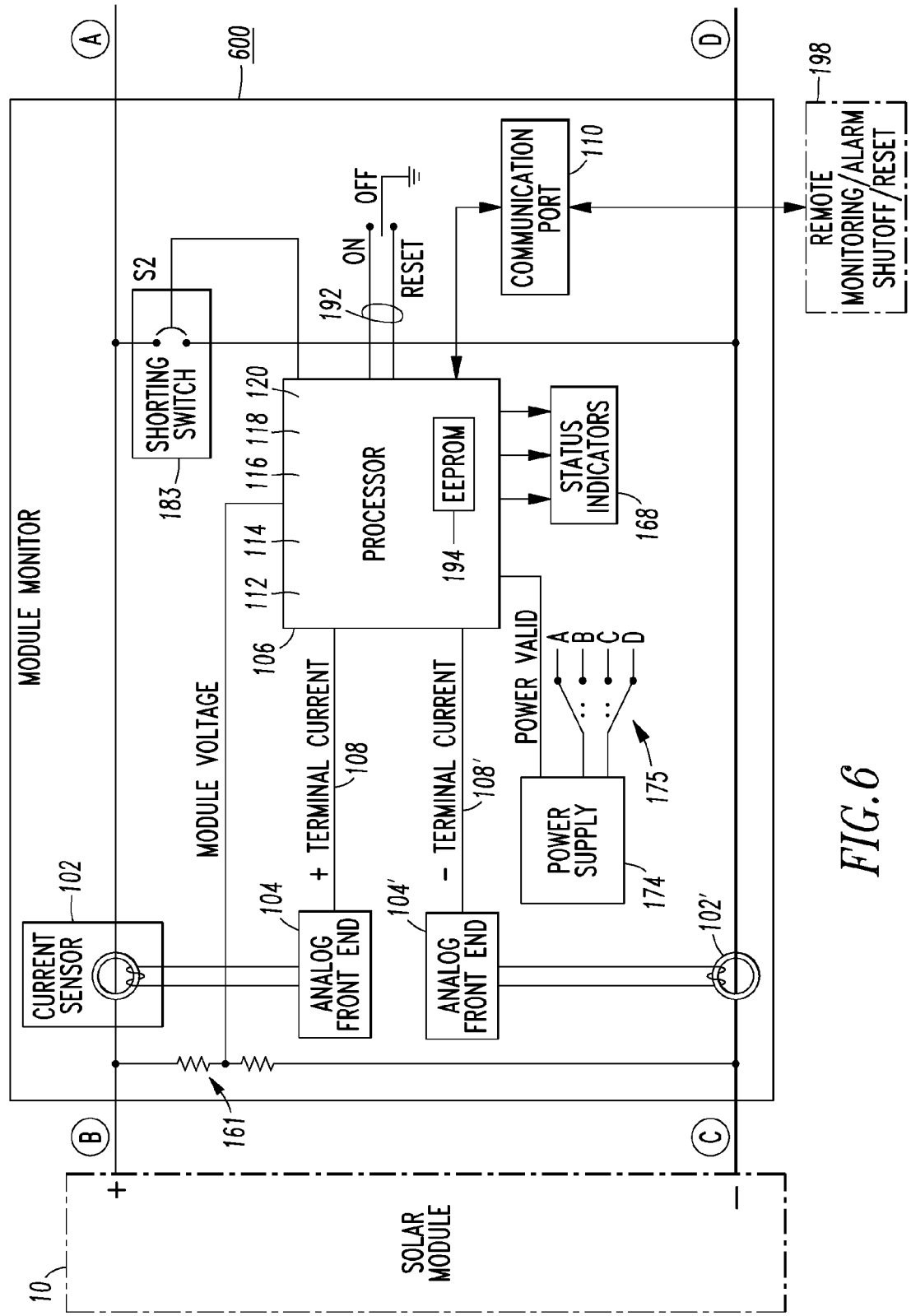
Figure 7:
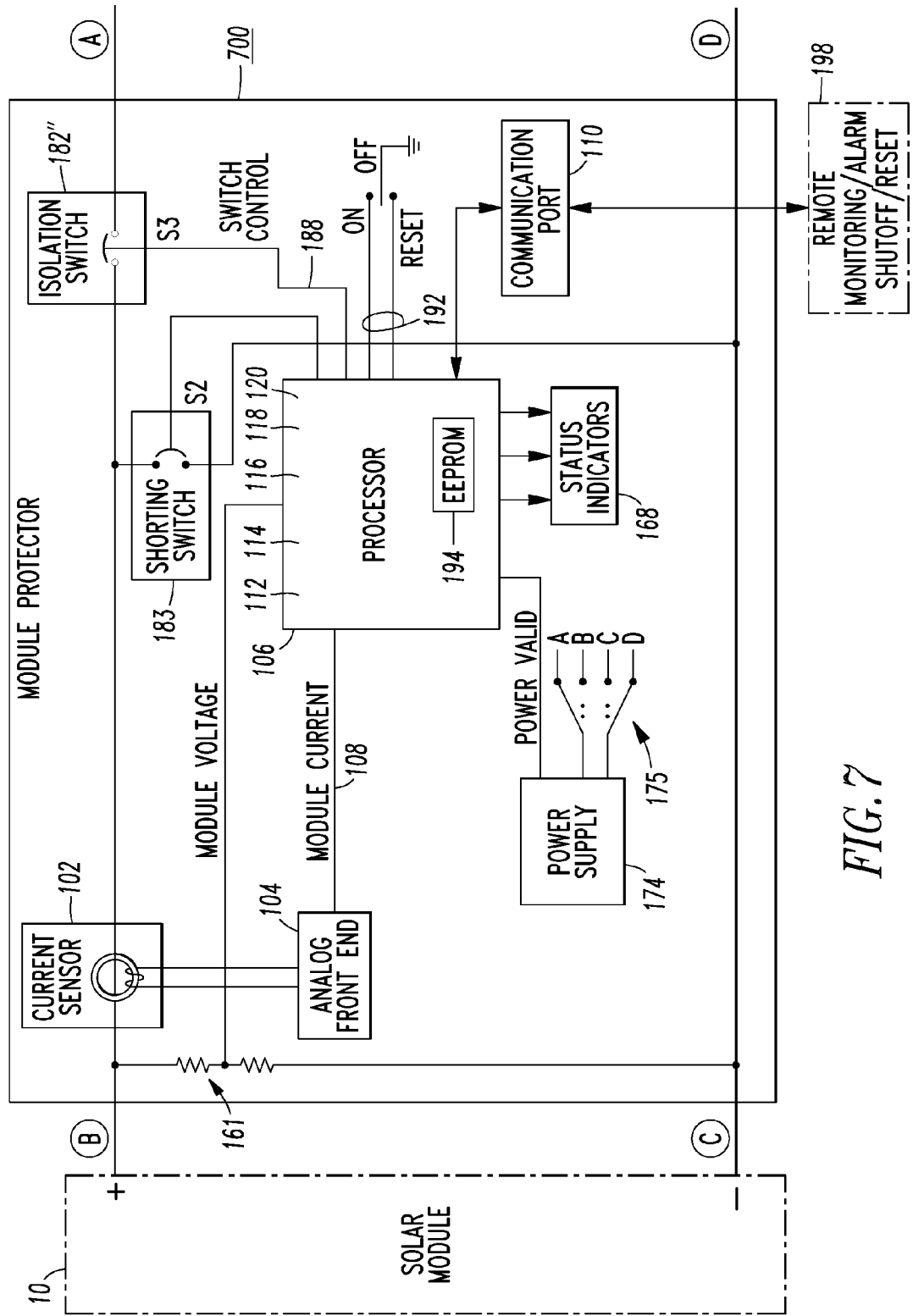

FIGS. 5, 6 and 7 show solar or photovoltaic (PV) module monitors or protectors 500,600,700, respectively, which are somewhat similar to the MP 100' of FIG. 2B. The module monitor/detector 500 of FIG. 5 does not employ any of the isolation switches S1,S3 or shorting switch S2, but can be employed for the passive diagnostic algorithms 324 of FIG. 3A or the (passive) diagnostic algorithms 324' of FIG. 3B. This provides a relatively lower cost and a relatively higher reliability for monitoring and/or passive diagnostics.

The module monitor/detector 600 of FIG. 6 does not employ any of the isolation switches S1,S3, but can be employed for the passive diagnostic algorithms 324 of FIG. 3A, the (passive) diagnostic algorithms 324' of FIG. 3B, or to measure I_sc as part of the (active) diagnostic algorithms 324' of FIG. 3B. This provides a relatively lower cost and a relatively higher reliability for monitoring and/or passive diagnostics and/or an active diagnostic.

The processor 106 of FIG. 6 can employ the current sensor 102 or 102' to measure an operational current, employ the voltage sensor 161 to measure an operational voltage, determine if the operational current is about zero (as shown at or about point 1328 of FIG. 13B), determine if the operational voltage is about zero (as shown at or about point 1328 of FIG. 13B), and responsively determine an internal fault of the solar module 10 and employ the status indicators 168 to indicate the internal fault, which can be one of an internal open circuit and an internal short of the solar module 10.

The processor 106 of FIG. 6 can employ the current sensor 102 or 102' to measure the operational current, measure the short circuit current I_sc, determine if the operational current is less than a predetermined percentage of the short circuit current (e.g., without limitation, 50% of I_sc; line 1330 of FIG. 13B), and responsively determine a reduced power condition or, in the case of the operational current being at or about zero, an external open circuit is detected and employ the status indicators 168 to indicate an external fault.

The module protector 700 of FIG. 7 does not employ the second isolation switch S1 or the second current sensor 102', but can be employed for the passive diagnostic algorithms 324 of FIG. 3A, the (passive) diagnostic algorithms 324' of FIG. 3B, the (active) diagnostic algorithms 324' of FIG. 3B, and for module protection with one isolation switch S3 excluding the ground fault protector 118. This provides a relatively lower cost and a relatively higher reliability for monitoring and/or passive diagnostics and/or active diagnostics and/or protection other than ground fault protection.

Figure 8:
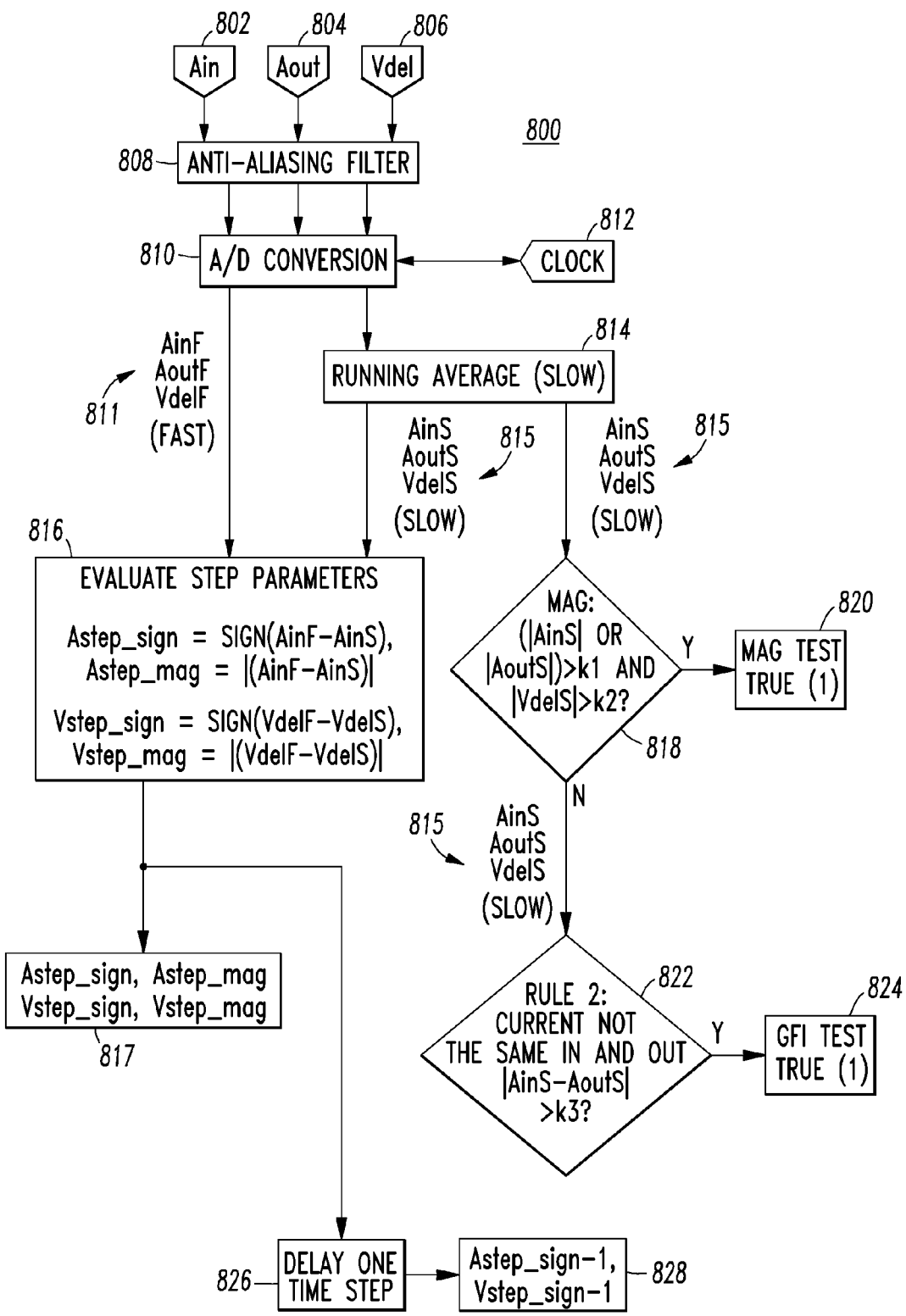
FIGS. 8 and 9A-9B are flowcharts of two routines employed by the processor of FIGS. 2A and 2B in accordance with other embodiments of the disclosed concept.
Figure 9A:
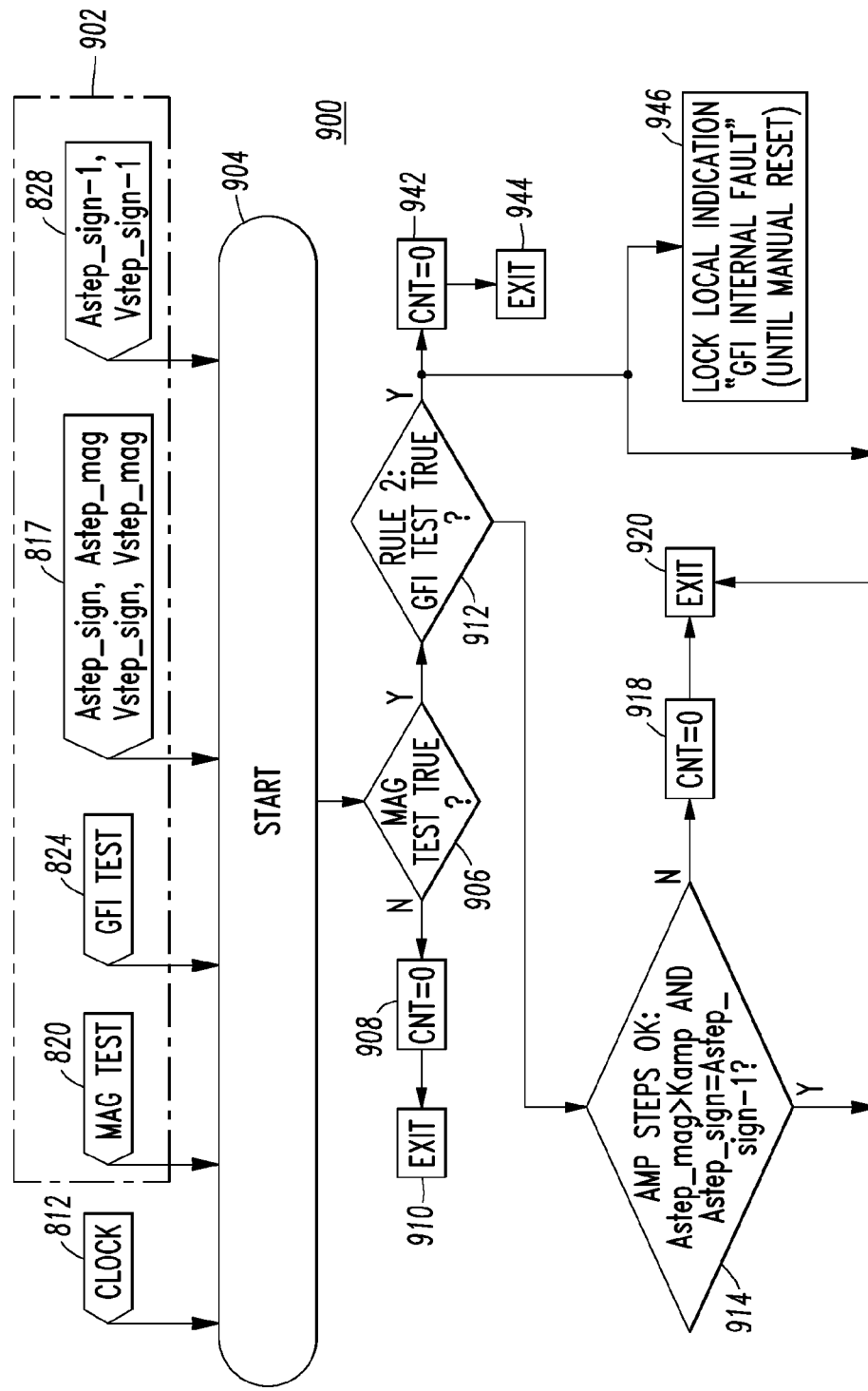
Figure 9B:
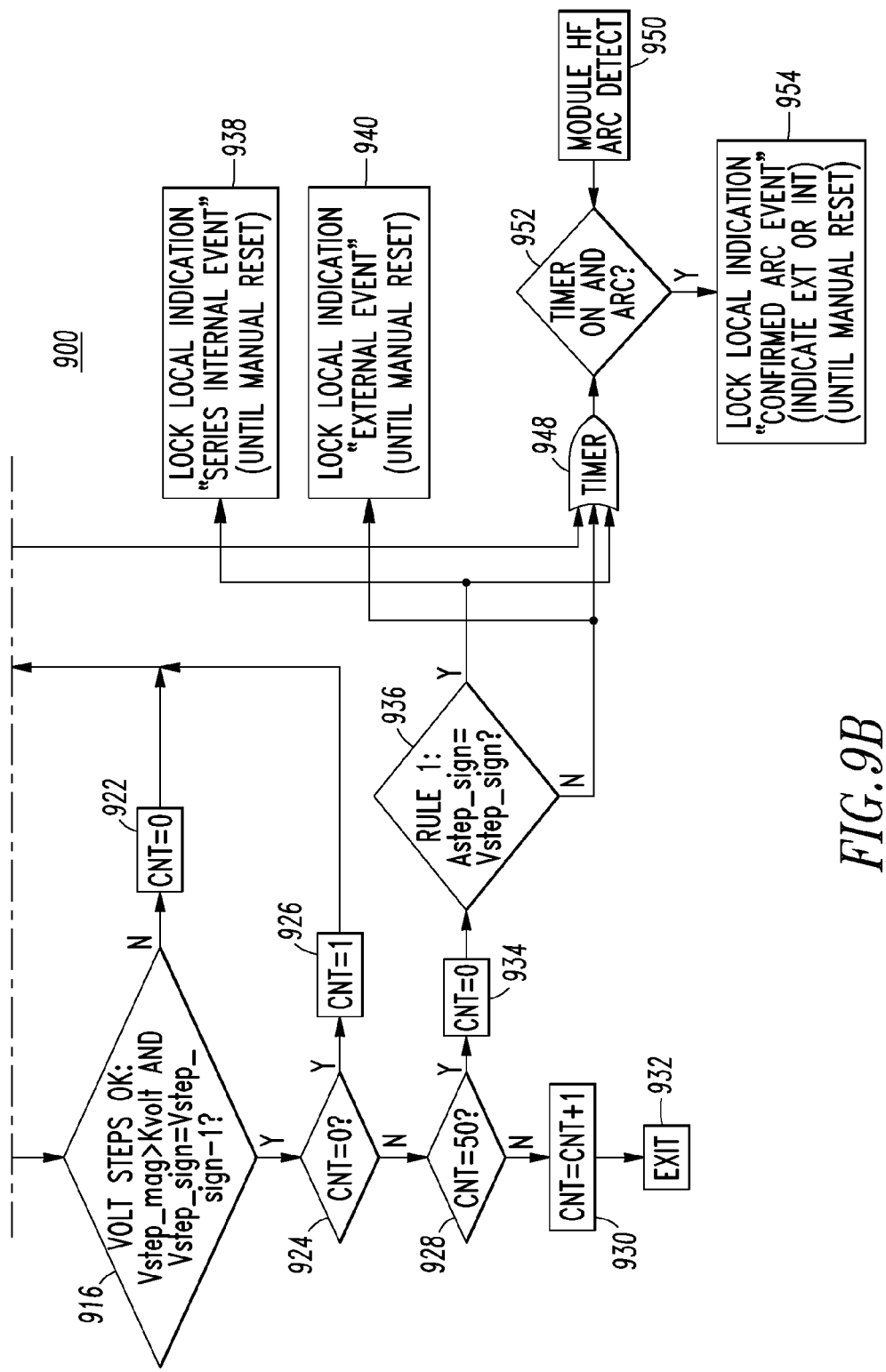

Referring to FIGS. 8 and 9A-9B, the processor 106 (e.g., FIGS. 2A and 2B) includes a routine 800 (FIG. 8) to pre-process various sensor data, and a routine 900 (FIGS. 9A-9B) to determine if an internal ground fault, an internal series fault, or an external fault is present. The signals Ain (amperes in) 802, Aout (amperes out) 804 and Vdel (volts delta) 806 are sensed by the current sensor 102' (typically near the module "−" terminal of FIG. 4A), the current sensor 102 (typically near the module "+" terminal of FIG. 4A) and the voltage sensor 161 (across the module "+" and "−" terminals; measured positive (typically) on the feed end), respectively. Ain 802 and Aout 804 are defined to be positive for the generating direction. An anti-aliasing filter 808 (e.g., without limitation, about 70 kHz typical) is employed prior to analog to digital (A/D) conversion 810. The processor 106 preferably provides relatively fast data sampling through an A/D converter (shown as A/D conversion 810 of FIG. 8) (e.g., without limitation, 8 bits; 1% including sign) as determined by clock 812 (e.g., without limitation, 5 µS or 200 kHz), and a relatively slow running average 814 (e.g., without limitation, 5 µS*200 samples=1 mS). The A/D conversion 810 provides fast data 811 (AinF, AoutF, VdelF) and the relatively slow running average 814 provides running averages 815 (AinS, AoutS, VdelS), where "S" indicates "slow" or averaged, and "F" indicates "fast" or sampled. After the A/D conversion 810 and the relatively slow running average 814, function evaluate step parameters 816 determines differences between "slow" and "fast" sign and magnitude, and provides, for current, Astep_sign=SIGN(AinF−AinS) and Astep_mag=|(AinF−AinS)|, and, for voltage, Vstep_sign=SIGN(VdelF−VdelS) and Vstep_mag=|(VdelF−VdelS)|. Function evaluate step parameters 816 outputs the step signs (Astep_sign, Vstep_sign) and step magnitudes (Astep_mag, Vstep_mag) at 817.

A magnitude (MAG) test 818 checks if (|AinS| or |AoutS|)>k1 (e.g., without limitation 1 A), and |VdelS|>k2 (e.g., without limitation, 50% V_oc volts) are both suitably large. If so, then a MAG TEST signal 820 is set true.

A second rule (Rule 2) 822 checks if the current is not the same for both slow input current (AinS) and slow output current (AoutS) if |AinS−AoutS|>k3 (e.g., without limitation, 10 mA), then the second rule is true and a GFI TEST signal 824 is set true.

A delay 826 is provided to determine the delayed step signs 828 (Astep_sign−1, Vstep_sign−1), which are one sample (e.g., without limitation, 5 µS prior to the present step signs (Astep_sign, Vstep_sign), respectively).

Referring to FIGS. 9A-9B, the routine 900 employs available data 902 at the sample rate of the clock 812 (e.g., without limitation, 200 kHz, typical). The example routine 900 is clock driven (e.g., without limitation, by an interrupt every 5 µS at 812) and starts at 904. The counter (CNT) is initially set to zero at start up. At the end of every logic decision path, the counter (CNT) is either reset to zero or incremented to CNT=CNT+1, as will be discussed. The routine 900 runs in parallel with the other module protector algorithms (e.g., without limitation, the arc fault protector routine 114, which takes relatively more time to make a decision).

After 904, at 906, the MAG TEST 820 is checked to determine if there is sufficient current and voltage to continue running the routine 900. If not, then the counter (CNT) is reset to zero, at 908, and the routine 900 exists at 910. On the other hand, if MAG TEST 820 is true, then if GFI TEST 824 at 912 is not true, then at 914, function AMP STEPS OK checks if Astep_mag>Kamp and if Astep_sign=Astep_sign−1. Ultimately, at 928 (FIG. 9B), the counter (CNT) makes sure that consecutive and consistent steps (e.g., without limitation, about 50 typical; any suitable value) in voltage and current are present to establish an event. If the test is true at 914, then, at 916, function VOLT STEPS OK checks if Vstep_mag>Kvolt and Vstep_sign=Vstep_sign−1. For 914 and 916, respective Kamp and Kvolt are set, for example and without limitation, to about 5% of the magnitude of the current AinS 815 and the voltage VdelS 815, respectively.

Otherwise, if either of the tests at 914 and 916 is false, then at 918 and 922, respectively, the counter (CNT) is reset to zero before the routine 900 exits at 920. On the other hand, if both of the tests at 914 and 916 are true, then, at 924, the counter (CNT) is checked to be zero. If so, then the counter (CNT) is set to one before the routine 900 exits at 920. On the other hand, if the counter (CNT) is not zero at 924, then, at 928, the counter (CNT) is checked to be a suitable value (e.g., without limitation, 50; any suitable value). If so, then the counter (CNT) is incremented, at 930, before the routine 900 exists at 932. Otherwise, if the counter (CNT) is the suitable value at 928, then the counter (CNT) is reset to zero, at 934, and then the first rule (Rule 1) is executed at 936.

For the first rule (Rule 1) 936, a fast transient event (e.g., the difference between fast sampled and slow averaged data) that persists over a predetermined time (e.g., without limitation, the counter (CNT) counts a suitable count, such as 50 samples*5 μS=250 μS) for both Ain 802 (or Aout 804, which is essentially the same as Ain 802 in the absence of an internal ground fault, which is employed to make the first rule test valid) and Vdel 806. If the sign of steps (Astep_sign=Vstep_sign) for both Ain 802 and Vdel 806, respectively, are the same, then the first rule is true. This implies that there is an internal series fault, which is locked, at 938, for local indication by status indicators 168 (e.g., FIGS. 2A and 2B) and/or communicated remotely by communication port 110 (e.g., FIGS. 2A and 2B). On the other hand, if the first rule is false (and here, the second rule at 912 is also false), then the event is external, which is locked for local indication and/or communicated remotely at 940. Otherwise, at 912 (FIG. 9A), if the second rule is true, then the fault is an internal ground fault, which is locked for local indication and/or communicated remotely at 946. Also, if the second rule is true, then the counter (CNT) is reset to zero at 942 before the routine 900 exits at 944, since any first rule test would be invalid in this case.

In summary, the second rule (822 of FIG. 8 as checked at 912 of FIG. 9A) tests to see if an internal ground fault is present. The first rule (936 of FIG. 9B) tests to see if an internal series fault is present or, if not, then there is an external fault. However, if the second rule is true, then the first rule is not run, since it cannot properly identify an internal versus an external fault location based on current paths and measurements.

Preferably, some optional additional steps can be performed to "confirm" a series arc event. Optionally, if any of the above three conditions (internal ground fault, internal series fault, external fault) is met, then a timer 948 (e.g., without limitation, 0.2 S) is started to coordinate the state with a separate arc fault algorithm 950 for fault or arc detection (e.g., without limitation, a suitable high-frequency fault or arc detection algorithm, which generally cannot be used to locate the event), whereby the "result" can be "confirmed", with additional location information. The optional timer 948 allows the arc fault algorithm 950 to complete and confirm that an arc fault is internal versus external. If the timer 948 expires and the arc fault algorithm 950 indicates an arc fault, then the status indicators 168 (e.g., FIGS. 2A and 2B) hold an internal series fault from 938 or hold an external fault from 940. If an external event 940 and an arc fault 950 are both true at 952, then an external arc fault is confirmed at 954. However, since it is external, it could be an external series arc fault or an external parallel arc fault. The occurrence of both the expiration of the timer 938 and the indication of an arc fault from 950 permit the internal series fault of 938 or the external fault of 940 to be deemed an "internal series arc fault" or an "external arc fault", respectively. This is because the first rule (Rule 1) 936 only determines if a fault is internal or external when a ground fault is not present. When the test 952 is performed after timer 948 expires and an arc fault is detected at 950, this confirms that it was an "internal arc fault" (if either test at 946 or 938 was true meaning that either an internal ground fault or an internal arc fault are independently detected and present) or was an "external arc fault" (if the test at 940 is true). All of the various indications aid maintenance personnel in locating a fault, until a manual reset occurs.

An internal ground fault is caused by having a current leakage to ground, and is detected by Ain 802 and Aout 804 not matching, since some current is taking an alternate ground path. An internal parallel arc fault also looks like an internal ground fault, with the addition of arcing. That is why there is not a separate test for an internal parallel arc fault.

The arc fault protector routine 114 (FIGS. 2A and 2B) causes a number of isolation switches (e.g., S1 and/or S3) to open if an arc is detected, regardless whether the arc is internal or external. This occurs independent of the ground fault protector routine 118 (FIGS. 2A and 2B). If both an internal ground fault and an arc fault are indicated, then the cause is likely an internal parallel arc fault to ground.

The various sensor data 902 is constantly sampled and the optional timer 948 can be reset at any time due to another event indication. The disclosed routine 900 continuously runs and can continue to indicate other events and reset the optional timer 948. Alternatively, the routine 900 can be stopped after an indication until a manual or system level reset is provided.

Figure 10:
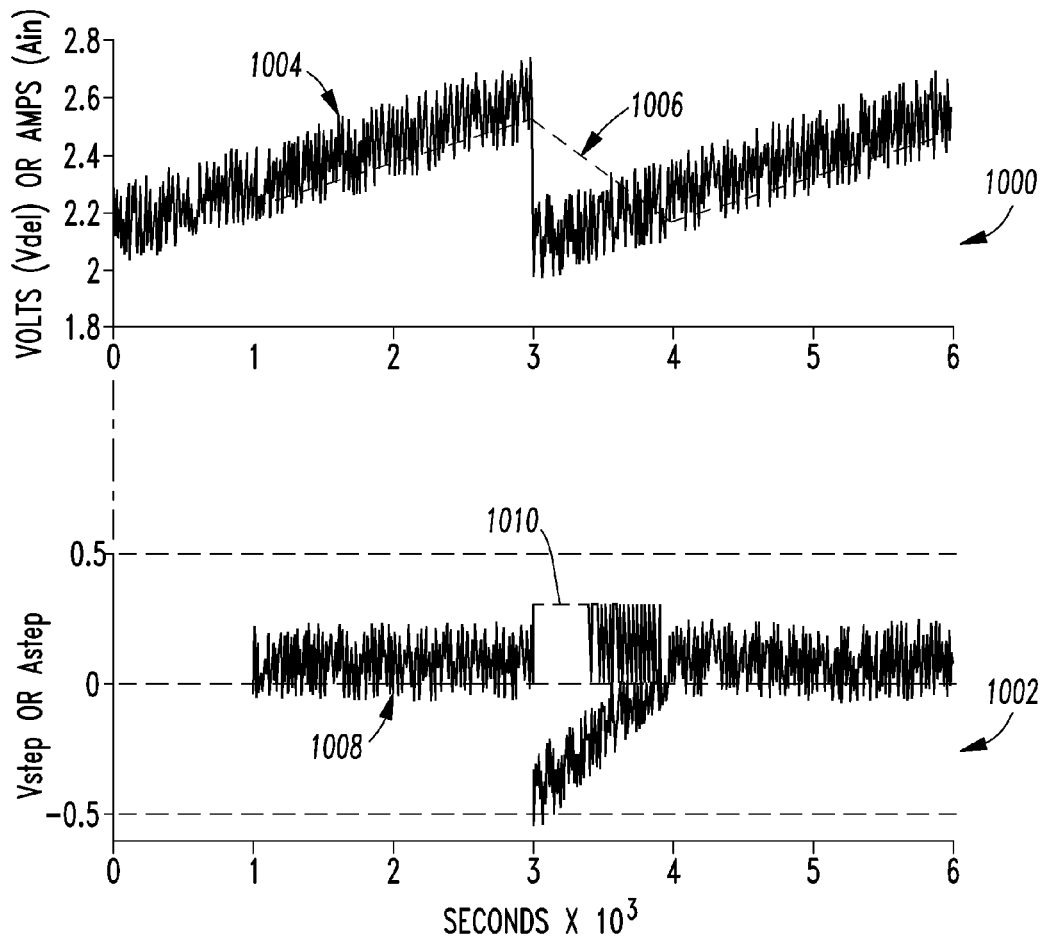
FIG. 10 shows two plots of voltages or currents versus time in accordance with an embodiment of the disclosed concept.

FIG. 10 shows two plots 1000,1002 of data for a transient (step) event. The plot 1000 shows the sampled VdelF or AinF value, and the timing (e.g., 50 consecutive samples) needed to pass the first rule (Rule 1) 936 (internal series fault) of FIG. 9B. This includes parameters employed in the valid step (Rule 1) algorithm 936. The signal 1004 (see 811 of FIG. 8) of the plot 1000 is 200 kHz sampled and anti-aliased data from filter 808 of FIG. 8. The signal 1006 (VdelS or AinS) (see 815 of FIG. 8) is the running average of the last N samples (e.g., without limitation, N=200; 0.1 mS). The signal 1008 (see 817 of FIG. 8) of the plot 1002 is the difference of data from the first plot 1000 (i.e., Vstep_mag or Astep_mag). The signal 1010 shows whether a step is valid ("OK") for at least the example 50 samples=0.25 mS, since the magnitude and "same sign" conditions are met for the example timing of 50 consecutive samples. If both VdelS and AinS satisfy the above criteria, then it remains only to compare their relative sign in order to determine if the fault is "internal" or "external" to the module.

Figure 11:
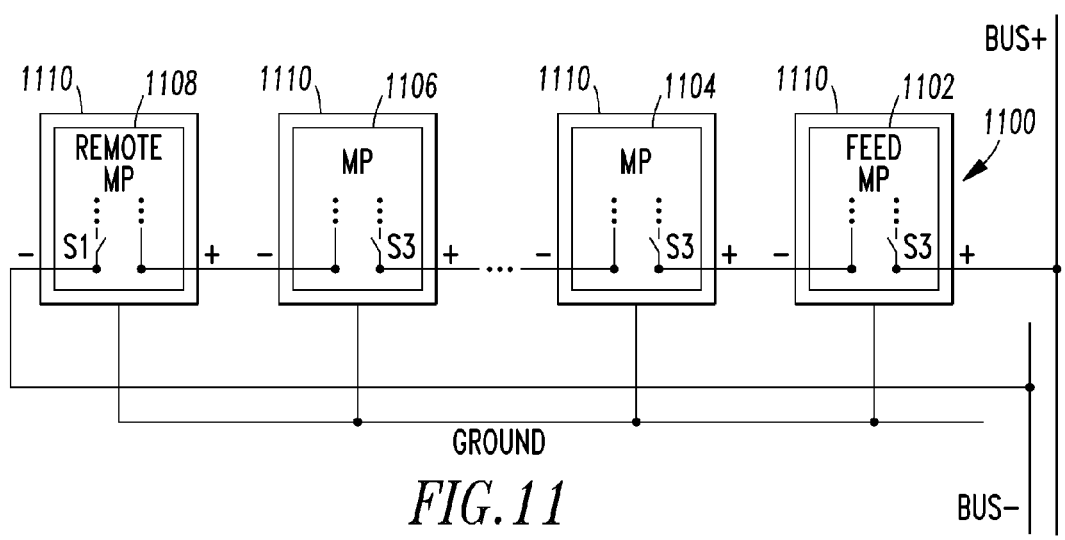
FIG. 11 is a block diagram of a string including PV module protectors similar to those of FIG. 7 in which each PV module protector employs one current sensor and one isolation switch to clear all string faults in accordance with another embodiment of the disclosed concept.

FIG. 11 shows a string 1100 including plural module protectors MPs 1102,1104,1106,1108, which can be the same as or similar to the MPs 100,100' of FIGS. 2A and 2B or the MP 700 of FIG. 7. Similar to the MP 700, each of the MPs 1102,1104,1106,1108 employs one current sensor 102 (not shown in FIG. 11) and one isolation switch (either S3 or S1) to clear all string faults. The MPs 1102,1104,1106,1108 in the string 1100 provide an efficient solution in terms of clearing all faults using one current sensor and one isolation switch, without knowledge of fault location. In this example, the MPs 1102,1104,1106 employ isolation switch S3, while only the remote MP 1108 employs isolation switch 51. All single faults are cleared remote of the feed terminal, since no current path is provided. Preferably, the module isolation switch is flexible, in order that it can easily be installed, activated or moved between feed and remote module ends (+ and –, typically).

Figure 12:
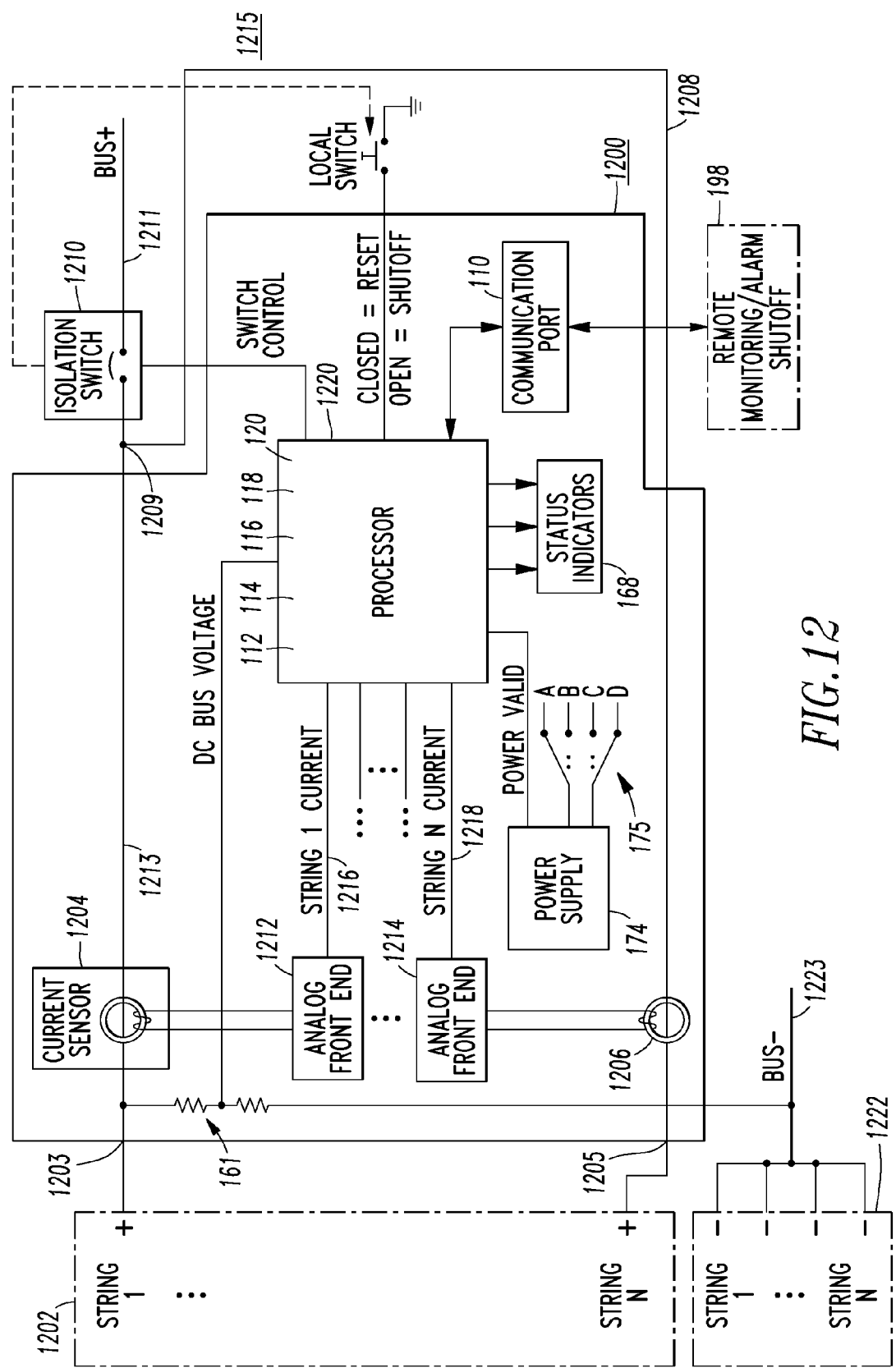
FIG. 12 is a block diagram of a multiple string protector in accordance with another embodiment of the disclosed concept.

FIG. 12 shows a multiple string protector 1200, which is somewhat similar to the module protector 100 of FIG. 2A, that can be applied to a single string. Here, there are multiple (N>=2) strings 1202 in which STRING_1 and STRING_N are shown. The positive ("+") output of each string goes to a corresponding input 1203,1205 and through a corresponding individual current sensor (e.g., two current sensors 1204, 1206 are shown), is externally combined at 1208 to form a node 1209, and then goes to a single, external isolation switch 1210, which outputs BUS+ 1211 for an array 1215. The example current sensors 1204,1206 are part of the multiple string protector 1200, but the various string conductors, such as 1213, pass through the multiple string protector 1200. The output of each of the example current sensors 1204,1206 is input by a corresponding analog front end 1212,1214, which outputs a corresponding string current 1216,1218, respectively, for input by processor 1220. Again, although only two analog front ends 1212,1214, and two string currents 1216, 1218 are shown (e.g., N=2), it will be appreciated that three or more strings, analog front ends and string currents can be employed. As a non-limiting example, there can be N=8 current sensors, analog front ends, string currents and processor inputs. The negative ("–") output of each string can simply be combined at a terminal block 1222, which outputs BUS– 1223.

Somewhat similar to the module protector processor 106 (e.g., FIGS. 2A and 2B) for one bus, the multiple string protector processor 1220 is structured to detect faults on each of the N strings 1202 (e.g., without limitation, in a combiner box, such as 18 of FIG. 1), but save on cost and space by having one processor 1220 and one isolation switch 1210. For example, in a combiner box there is the multiple string protector 1200 with multiple sensor inputs for each string to one processor 1220, with one isolation switch 1210 for the BUS+ 1211 feed to an inverter (e.g., without limitation, inverter 22 of FIG. 1). This provides for better detection and location of a fault, but reduces the cost by having only one relatively higher current isolation switch 1210 (e.g., without limitation, a circuit breaker; a disconnect).

A known prior device only measures per channel (string) instantaneous DC current and average DC current. A central computer reads this information out of the device to "monitor" the strings. In contrast, the disclosed multiple string protector 1200 not only measures DC currents, but also performs fault detection algorithms (e.g., without limitation, arc fault, reverse current, overcurrent, feed forward fault, passive diagnostics, communications for remote control and monitoring). Optionally, a second current sensor (not shown) for each string negative ("–") conductor can be employed for ground fault detection (not shown in FIG. 12).

Strings in today's PV arrays are required to be protected by fuses or circuit breakers (not shown). The fuse is sized to have, for example, a rating of 150% of the rated string current. If a string is feeding a short circuit, then the maximum string current can only reach about 110% of rated string current. Fuses only provide protection for faults resulting in relatively large currents back-feeding from many other strings into the fault. For short circuits toward the inverter, no feed-forward fault protection is provided by fuses.

Measuring voltage and current at the module or string level can open opportunities for a better protection system and add the ability to perform diagnostics on the module or the string. For example, current and voltage can be employed to provide a suitable feed forward fault protection device, as is discussed, below, in connection with FIG. 13B. Also, estimations of temperature and illumination can be employed to provide an estimate of the MPP (shown as $MPP_E$ in FIG. 13B) that can be compared to the operating point (shown as MPP 1314 in FIG. 13B, located at Vop and Iop) to give a better understanding of string or module performance.

Figure 13A:
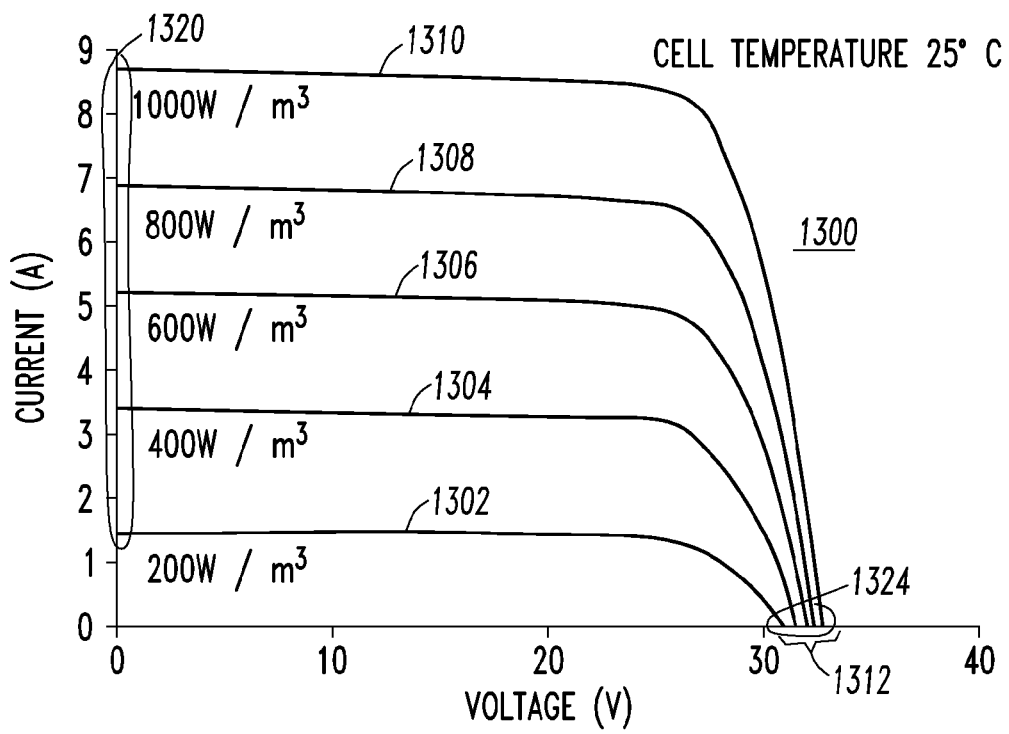
FIG. 13A is a plot of PV module current versus voltage for various illumination levels at a predetermined cell temperature.

The following discusses a diagnostic algorithm to determine if a module, such as 10 (FIG. 1), is operating at a valid working point (shown as MPP region 1326 in FIG. 13B) (e.g., centered around the estimated point (shown as $MPP_E$ in FIG. 13B) and, for example and without limitation, covering a square or circle around it at about +/–20% of the estimated MPP; alternatively, the region could be defined by the two ranges 80% V_oc to V_oc and 80% I_sc to I_sc, which is simpler to calculate but not as accurate). FIG. 13A shows a current-voltage (I-V) characteristic (generally provided by a corresponding module manufacturer) 1300 for an example module (not shown) at different illumination levels 1302, 1304,1306,1308,1310. An open loop system voltage 1312 is reached at relatively very low illumination levels almost immediately (e.g., in FIG. 13A (intersection at I=0 A), the open loop voltage 1312 is established with relatively very little illumination).

Figure 13B:
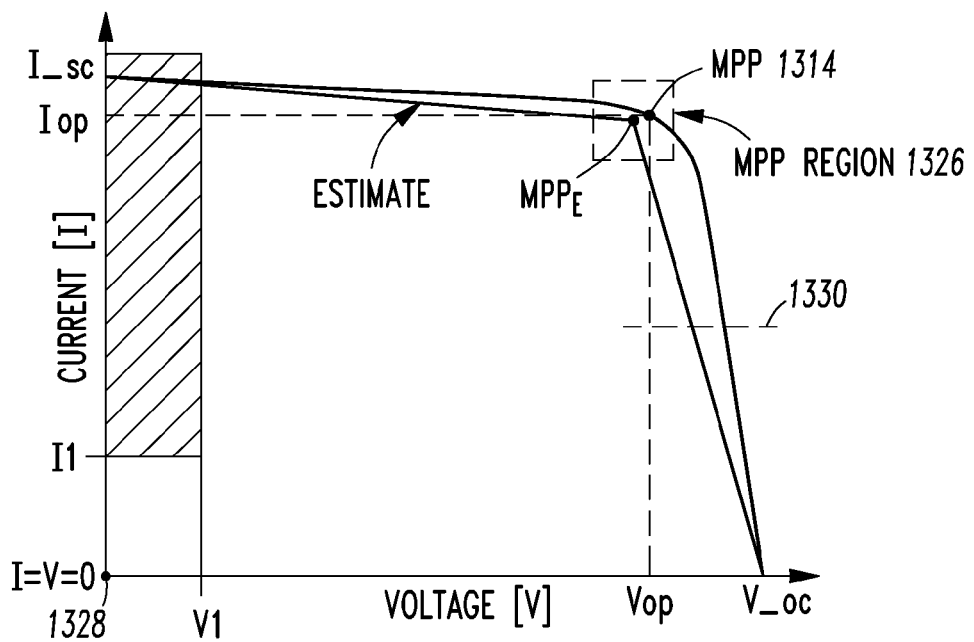
FIG. 13B is a plot of PV module current versus voltage including a maximum power point (MPP), a MPP region and an estimate of the MPP in accordance with another embodiment of the disclosed concept.

FIG. 13B shows that an inverter (shown in FIG. 1) can find a maximum power point (MPP) 1314 to maximize the power generated by a module or string. When a string or module is shorted in the feed forward direction, the current will rise a bit and the voltage will collapse. The rise in current is not enough to blow a fuse (not shown) or trip a circuit breaker (not shown). With a voltage sensor (e.g., 161 of FIGS. 2A and 2B), however, an unsafe feed forward fault area (e.g., an overload; a short circuit condition) can be determined. For a soft source like a PV string, when a short circuit occurs in the feed forward direction (e.g., closer to the inverter), normal over current protection is unable to detect and mitigate (e.g., the current could rise to, for example, 110% of rated current, which is not enough to trip an over current protection device). Here, if the voltage collapses and the current is relatively high, then "feed forward fault protection", such as 120 of FIGS. 2A and 2B, can detect this abnormal condition.

When the voltage of the string falls below value V1 while maintaining a significant current above I1, it can be assumed that the string is in a feed forward fault condition and the protection device can be tripped according to a predetermined trip-time curve. For example, V1 and I1 (that define the feed forward fault trip region) can simply be selected as suitable percentages of V_oc (e.g., without limitation 20%; any suitable percentage of V_oc) and I_sc (e.g., without limitation 50%; any suitable percentage of I_sc), which can be obtained from a PV module data sheet. This permits the feed forward fault protector routine 120 (e.g., FIGS. 2A and 2B) to be performed in both FIGS. 3A and 3B. Measured V_oc and I_sc values (Equations 1 and 2, below) are only available for FIGS.

2B and 3B, since switches S2 and (S1 or S3) are available to perform active diagnostics. Since it is possible to detect the feed forward fault without much knowledge of the illumination level or the module temperature, this protection can be provided without any active or passive diagnostics.

If the illumination level and cell temperature can be determined, then it is possible to make a relatively more accurate statement about the state of the module or string.

Figure 13C:
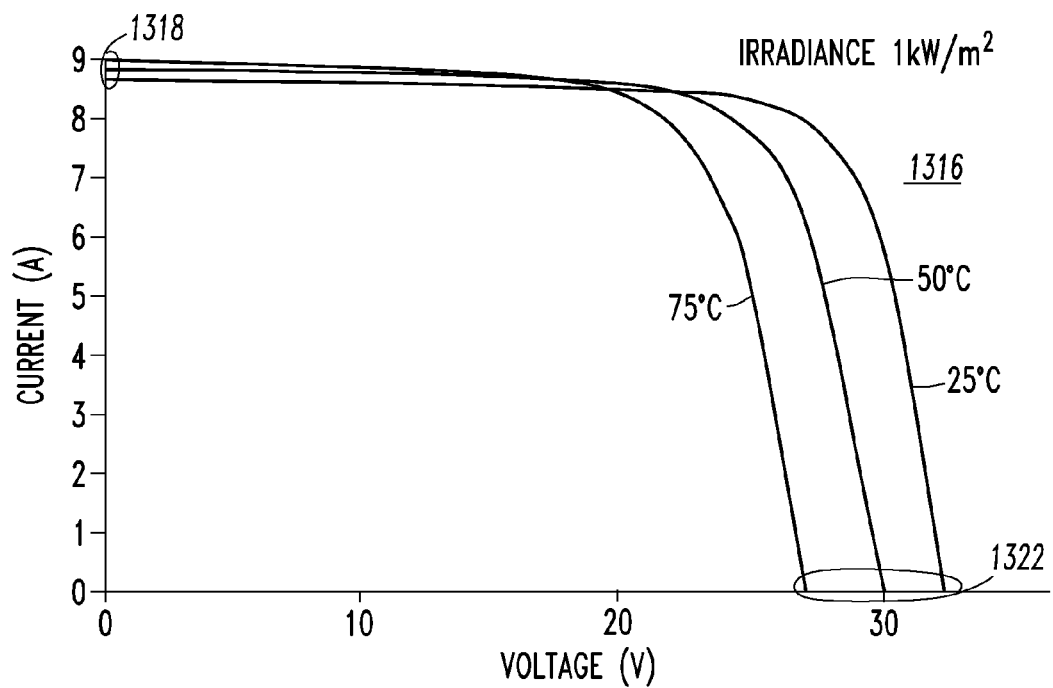
FIG. 13C is a plot of PV module current versus voltage for various temperatures at a predetermined illumination level.

As shown in FIGS. 13A (illumination dependence) and 13C (temperature dependence), the I-V curves 1300,1316 are dependent on illumination and temperature, respectively. Temperature changes have mostly an effect on the open loop voltage as shown in FIG. 13C. Illumination changes have mostly an effect on the short circuit current as shown in FIG. 13A.

By employing published or other known data (e.g., without limitation, data for a given module manufacturer and model), the following data can be incorporated into the disclosed protectors (e.g., 100,100' of FIGS. 2A and 2B):

V_oc_ref open circuit voltage at reference illumination and temperature (e.g., without limitation, 25° C. and 1 kW/m², respectively);

I_sc_ref short circuit current at reference illumination and temperature;

V_mpp_ref voltage at MPP at reference illumination and temperature; and

I_mpp_ref current at MPP at reference illumination and temperature.

The changes of the short circuit current with respect to temperature and illumination, and the changes to the open loop voltage with respect to temperature and illumination are also determined, and can be suitably estimated from the above published or other known data (e.g., without limitation, data for the given module manufacturer and model; FIGS. 13A and 13C), and also can be incorporated into the disclosed protectors:

$dI\_sc/dT$ change in I_sc per change in temperature (see, for example, FIG. 13C at the 0 V intercepts 1318 where the value is about 0.25 A/50° C.);

$dI\_sc/dILL$ change in I_sc per change in illumination (see, for example, FIG. 13A at the 0 V intercepts 1320 where the value is about 7.3 A/(0.8 kW/m²));

$dV\_oc/dT$ change in V_oc per change in temperature (see, for example, FIG. 13C at the 0 A intercepts 1322 where the value is about −5.5 V/50° C.); and $dV\_oc/dILL$ change in V_oc per change in illumination (see, for example, FIG. 13A at the 0 A intercepts 1324 where the value is about 2 V/(0.8 kW/m²).

With the above reference points and the rate of changes of these reference points due to temperature and illumination, suitable active diagnostics can be performed on a module or string using two switches. An opening switch (e.g., without limitation, 182" and/or 182'" of FIG. 2B) to stop current flow and a shorting switch (e.g., without limitation, 183 of FIG. 2B) across the module or string for creating a short circuit. The opening switch is opened to measure V_oc. After determining the open loop voltage, the shorting switch is closed to measure I_sc. Next, the short circuit current and open loop voltage can be determined at the present temperature and illumination using the deviation (delT and delILL) from the reference point (e.g., without limitation, T_ref=25° C. and ILL_ref=1 kW/m² in this example) of a particular module data (e.g., without limitation, from a datasheet (not shown) for the corresponding module manufacturer and model) with Equations 1 and 2:

$$I\_sc = I\_sc\_ref + dI\_sc/dT * delT + dI\_sc/dILL * delILL \quad (Eq. 1)$$

$$V\_oc = V\_oc\_ref + dV\_oc/dT * delT + dV\_oc/dILL * delILL \quad (Eq. 2)$$

In turn, the actual estimated temperature and illumination is determined from Equations 3 and 4:

$$T = T\_ref + delT \quad (Eq. 3)$$

$$ILL = ILL\_ref + delILL \quad (Eq. 4)$$

Then, the estimated MPP can be determined from Equations 5 and 6:

$$V\_mpp(T) = V\_mpp\_ref + dV\_oc/dT * (T - T\_ref) \quad (Eq. 5)$$

$$I\_mpp(ILL) = I\_mpp\_ref + dI\_sc/dILL * (ILL - ILL\_ref) \quad (Eq. 6)$$

wherein:

V_mpp_ref is, for example and without limitation, 32 V; and

I_mpp_ref is, for example and without limitation, 7.9 A.

Next, the operating point (advantageously near MPP 1314), defined as Vop and Iop, is compared with the estimated MPP point $MPP_E$ (V_mpp(T) and I_mpp(ILL)) adjusted for temperature (Equation 5) and illumination (Equation 6). If those two points are very different (e.g., without limitation, outside of the desired MPP region 1326 of FIG. 13B), then the module or string is not operating correctly. For example, this could be caused by partial shading of the string or module, a module being covered in dirt and needing to be cleaned, an internal fault is present, and/or an inverter not operating correctly. The above two points can also be tracked over time to see if the module or string operates at sub-optimal conditions during certain times of the day and/or if this changes over time. The protector can advantageously give an indication if the performance degrades and an operator can observe this and further investigate the health of the module or string.

Alternatively, a third order polynomial is employed as the estimator to provide relatively more accurate results as contrasted with the linear approximation shown in FIG. 13B and Equations 5 and 6.

For indications, the trip state is determined at 322 (FIG. 3A), 948 (FIG. 9B) or 938 (FIG. 9B), the shorted module state is determined by reverse/over current at 322 (FIG. 3A), a feed forward fault<V1 (FIG. 13B), and the open module state is determined by active diagnostics 324' of FIG. 3B.

It will be appreciated that any of the parameters being sensed, measured, calculated or estimated by the various monitors and protectors disclosed herein can be indicated locally using, for example and without limitation, one or more of the status indicators 168, such as combinations of a number of LEDs or other suitable visual indicators, or any suitable display apparatus (not shown). Also, various faults can be locally alarmed, for example and without limitation, using suitable visual and/or audible indicators, such as buzzers or horns. Furthermore, any of the above can be communicated remotely by communication port 110 for remote indication, remote display or remote alarming.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A protection apparatus for a direct current electrical generating apparatus, said protection apparatus comprising:
 a first terminal;
 a second terminal;
 a third terminal;
 a fourth terminal;

at least one current sensor structured to sense current flowing between the first and second terminals or between the third and fourth terminals;
a voltage sensor structured to sense a voltage between said first terminal and said third terminal;
at least one switch structured to interrupt said current flowing between the first and second terminals or between the third and fourth terminals; and
a processor cooperating with said at least one current sensor, said voltage sensor and said at least one switch, and being structured to provide feed forward fault protection for said direct current electrical generating apparatus,
wherein said protection apparatus is a protection module;
wherein said at least one switch is part of an electronically controlled relay controlled by said processor internal to said protection module;
wherein said processor includes at least one input and a number of indicators; and wherein said at least one input is structured to define one of a first off state to cause said processor to open said at least one switch and turn off said number of indicators, a second on state to cause said processor to close said at least one switch and turn on one of said number of indicators, and a third reset state to cause said processor to turn off said number of indicators.

2. A protection apparatus for a direct current electrical generating apparatus, said protection apparatus comprising:
a first terminal;
a second terminal;
a third terminal;
a fourth terminal;
at least one current sensor structured to sense current flowing between the first and second terminals or between the third and fourth terminals;
a voltage sensor structured to sense a voltage between said first terminal and said third terminal;
at least one switch structured to interrupt said current flowing between the first and second terminals or between the third and fourth terminals; and
a processor cooperating with said at least one current sensor, said voltage sensor and said at least one switch, and being structured to provide feed forward fault protection for said direct current electrical generating apparatus,
wherein said at least one current sensor is a first current sensor and a second current sensor;
wherein said first terminal, said third terminal, said first current sensor, said second current sensor and said processor form a protection module;
wherein said at least one switch, said second terminal and said fourth terminal are part of a circuit interrupter disposed external to said protection module;
wherein said circuit interrupter includes an auxiliary switch having an open or closed state corresponding to an open or closed state of said at least one switch;
wherein said processor includes a power on indicator, at least one fault indicator and at least one input including said auxiliary switch; and wherein said at least one input is structured to define one of a first off state to cause said processor to open said at least one switch and turn off said power on indicator and said at least one fault indicator, a second on state to cause said processor to turn on said power indicator and turn off said number of fault indicators, and a third off state.

3. The protection apparatus of claim 2 wherein said processor is structured to turn off said power indicator if said power indicator was turned on in said third off state, or to maintain said power indicator and said number of fault indicators if said power indicator was turned off in said third off state.

4. A protection apparatus for a direct current electrical generating apparatus, said protection apparatus comprising:
a first terminal;
a second terminal;
a third terminal;
a fourth terminal;
at least one current sensor structured to sense current flowing between the first and second terminals or between the third and fourth terminals;
a voltage sensor structured to sense a voltage between said first terminal and said third terminal;
at least one switch structured to interrupt said current flowing between the first and second terminals or between the third and fourth terminals; and
a processor cooperating with said at least one current sensor, said voltage sensor and said at least one switch, and being structured to provide feed forward fault protection for said direct current electrical generating apparatus,
wherein said at least one current sensor is a first current sensor structured to sense first current flowing between the first and second terminals and a second current sensor structured to sense second current flowing between the third and fourth terminals; and wherein said processor is structured to periodically determine a plurality of samples of said sensed first current and said sensed second current at a first rate, to periodically determine a plurality of averages of said plurality of samples of said sensed first current and said sensed second current at a second rate, which is slower than said first rate, to determine that a corresponding one of the plurality of averages of said plurality of samples of said sensed first current or said sensed second current is not less than a first constant, and to determine that an absolute value of a difference between the corresponding one of the plurality of averages of said plurality of samples of said sensed first current and the corresponding one of the plurality of averages of said plurality of samples of said sensed second current is greater than a second constant and responsively determine a ground fault and open said at least one switch.

5. An indication apparatus for a direct current electrical generating apparatus, said indication apparatus comprising:
a first terminal;
a second terminal;
a third terminal;
a fourth terminal;
at least one current sensor structured to sense current flowing between the first and second terminals or between the third and fourth terminals;
a voltage sensor structured to sense voltage between the first and third terminals;
at least one indicator; and
a processor cooperating with said at least one current sensor, said voltage sensor and said at least one indicator, and being structured to detect a fault event internal to or external to said indication apparatus and indicate a corresponding internal fault state or external fault state on said at least one indicator,
wherein said processor is structured to periodically determine a plurality of samples of said sensed current and said sensed voltage at a first rate, to periodically determine a plurality of averages of said plurality of samples of said sensed current and said sensed voltage at a second rate, which is slower than said first rate, to periodically determine a first value being a positive or negative sign of the difference between a corresponding one of the plurality of samples of said sensed current and a corresponding one of the plurality of averages of said plurality of samples of said sensed current, to periodically determine a second value being a positive or negative sign of the difference between a corresponding one of the plurality of samples of said sensed voltage and a corresponding one of the plurality of averages of said plurality of samples of said sensed voltage, to indicate the corresponding internal fault state if said first value equals said second value, and to indicate the corresponding external fault state if said first value does not equal said second value.

6. An indication apparatus for a direct current electrical generating apparatus, said indication apparatus comprising:
a first terminal;
a second terminal;
a third terminal;
a fourth terminal;
at least one current sensor structured to sense current flowing between the first and second terminals or between the third and fourth terminals;
a voltage sensor structured to sense voltage between the first and third terminals;
at least one indicator; and
a processor cooperating with said at least one current sensor, said voltage sensor and said at least one indicator, and being structured to detect a fault event internal to or external to said indication apparatus and indicate a corresponding internal fault state or external fault state on said at least one indicator,
wherein said at least one current sensor is a first current sensor structured to sense first current flowing between the first and second terminals and a second current sensor structured to sense second current flowing between the third and fourth terminals; and wherein said processor is structured to periodically determine a plurality of samples of said sensed first current, said sensed second current and said sensed voltage at a first rate, to periodically determine a plurality of averages of said plurality of samples of said sensed first current, said sensed second current and said sensed voltage at a second rate, which is slower than said first rate, to determine that a corresponding one of the plurality of averages of said plurality of samples of said sensed first current or said sensed second current is not less than a first constant or that a corresponding one of the plurality of averages of said plurality of samples of said sensed voltage is not less than a second constant, and to determine that an absolute value of a difference between the corresponding one of the plurality of averages of said plurality of samples of said sensed first current and the corresponding one of the plurality of averages of said plurality of samples of said sensed second current is greater than a third constant and responsively indicate a ground fault on one of said at least one indicator.

7. The indication apparatus of claim 6 wherein said processor comprises a high frequency arc detector; wherein said processor is further structured to periodically determine a first value being a positive or negative sign of the difference between a corresponding one of the plurality of samples of said sensed current and a corresponding one of the plurality of averages of said plurality of samples of said sensed current, to periodically determine a second value being a positive or negative sign of the difference between a corresponding one of the plurality of samples of said sensed voltage and a corresponding one of the plurality of averages of said plurality of samples of said sensed voltage, to indicate the corresponding internal fault state if said first value equals said second value, and to indicate the corresponding external fault state if said first value does not equal said second value; and wherein said processor is further structured to indicate an internal series arc fault if said high frequency arc detector indicates an arc fault and if after a predetermined time the corresponding internal fault state was indicated.

8. An indication apparatus for a direct current electrical generating apparatus, said indication apparatus comprising:
a first terminal;
a second terminal;
a third terminal;
a fourth terminal;
at least one current sensor structured to sense current flowing between the first and second terminals or between the third and fourth terminals;
a voltage sensor structured to sense voltage between the first and third terminals;
at least one indicator; and
a processor cooperating with said at least one current sensor, said voltage sensor and said at least one indicator, and being structured to detect a fault event operatively associated with the sensed current and the sensed voltage internal to said indication apparatus and indicate a corresponding internal fault state on said at least one indicator,
wherein said processor is further structured to detect a fault event external to said indication apparatus and indicate a corresponding external fault state on said at least one indicator; and wherein said at least one indicator includes at least a first indicator to indicate the corresponding internal fault state, a second indicator to indicate a series fault, and a third indicator to indicate a parallel fault.

9. A protection apparatus for a direct current electrical generating apparatus, said protection apparatus comprising:
a first terminal;
a second terminal;
a third terminal;
a fourth terminal;
at least one current sensor structured to sense current flowing between the first and second terminals or between the third and fourth terminals;
at least one switch structured to interrupt said current flowing between the first and second terminals or between the third and fourth terminals;
a processor cooperating with said at least one current sensor and said at least one switch, and being structured to provide fault protection for said direct current electrical generating apparatus; and
at least one input structured to define one of a first off state to cause said processor to open said at least one switch and a second on state to cause said processor to close said at least one switch,
wherein said processor includes at least one input and a number of indicators; and
wherein said at least one input is structured to define a first off state to cause said processor to open said at least one switch and turn off said number of indicators, and a second on state to cause said processor to close said at least one switch and turn on one of said number of indicators.

10. The protection apparatus of claim 9 wherein said at least one input is a local switch.

11. The protection apparatus of claim 9 wherein said at least one input is a communication port structured to receive a message to cause said processor to open said at least one switch.

12. The protection apparatus of claim 9 wherein said at least one input is a communication port structured to receive a message to cause said processor to close said at least one switch.

13. A monitoring apparatus for a direct current electrical generating apparatus, said monitoring apparatus comprising:
   a first terminal;
   a second terminal;
   a third terminal;
   a fourth terminal;
   a switch electrically connected between said second terminal and said fourth terminal;
   a voltage sensor structured to sense a voltage between said first terminal and said third terminal;
   a current sensor structured to sense a current flowing between said first terminal and said second terminal or between said third terminal and said fourth terminal;
   an indicator; and
   a processor cooperating with said voltage sensor, said current sensor, said indicator and said switch, and being structured to determine if the sensed voltage is less than a first predetermined percentage of a rated open circuit voltage and responsively causing said indicator to indicate a short or an overcurrent fault for said direct current electrical generating apparatus, and to provide:
      (i) temporarily closing said switch, measuring a short circuit current from said sensed current, and opening said switch; and
      (ii) determining if the sensed current is greater than a second predetermined value.

14. The monitoring apparatus of claim 13 wherein said processor is further structured to employ said current sensor to measure an operational current, determine if the operational current is less than a third predetermined percentage of the short circuit current, and responsively determine an external open circuit and employ said indicator to indicate an external fault.

15. A monitoring apparatus for a direct current electrical generating apparatus, said monitoring apparatus comprising:
   a first terminal;
   a second terminal;
   a third terminal;
   a fourth terminal;
   a switch electrically connected between said second terminal and said fourth terminal;
   a voltage sensor structured to sense a voltage between said first terminal and said third terminal;
   a current sensor structured to sense a current flowing between said first terminal and said second terminal or between said third terminal and said fourth terminal;
   an indicator; and
   a processor cooperating with said voltage sensor, said current sensor, said indicator and said switch, and being structured to provide at least one of:
      (i) determining if the sensed voltage is less than a first predetermined percentage of a rated open circuit voltage and responsively causing said indicator to indicate a short or an overcurrent fault for said direct current electrical generating apparatus;
      (ii) temporarily closing said switch, measuring a short circuit current from said sensed current, and opening said switch; and
      (iii) determining if the sensed current is greater than a second predetermined value,
   wherein said processor is further structured to employ said current sensor to measure an operational current, employ said voltage sensor to measure an operational voltage, determine if the operational current is about zero, determine if the operational voltage is about zero, and responsively determine an internal fault of said direct current electrical generating apparatus and employ said indicator to indicate the internal fault.

16. The monitoring apparatus of claim 15 wherein said internal fault is one of an internal open circuit and an internal short.

17. A protection apparatus for a direct current electrical generating apparatus, said protection apparatus comprising:
   a first terminal;
   a second terminal;
   a third terminal;
   a fourth terminal;
   a first switch electrically connected between said first terminal and said second terminal or between said third terminal and said fourth terminal;
   a second switch electrically connected between said second terminal and said fourth terminal;
   a voltage sensor structured to sense a voltage between said first terminal and said third terminal;
   a current sensor structured to sense a current flowing between said first terminal and said second terminal or between said third terminal and said fourth terminal;
   an indicator; and
   a processor cooperating with said voltage sensor, said current sensor, said indicator, said first switch and said second switch, and being structured to:
      (i) determine if the sensed voltage is less than a first predetermined percentage of a rated open circuit voltage and responsively cause said indicator to indicate a short or an overcurrent fault for said direct current electrical generating apparatus;
      (ii) temporarily close said second switch, measure a short circuit current from said sensed current, and open said second switch;
      (iii) determine if the sensed current is greater than a second predetermined value; and
      (iv) provide non-ground fault protection for said direct current electrical generating apparatus.

18. The protection apparatus of claim 17 wherein said direct current electrical generating apparatus is a photovoltaic module; and wherein said processor is further structured calculate at least one of maximum power point, temperature and illumination of said photovoltaic module.

19. The protection apparatus of claim 18 wherein said processor is further structured to estimate the temperature and estimate the illumination from:

$$I\_sc = I\_sc\_ref + dI\_sc/dT * delT + dI\_sc/dILL * delILL$$

$$V\_oc = V\_oc\_ref + dV\_oc/dT * delT + dV\_oc/dILL * delILL$$

$$T = T\_ref + delT$$

$$ILL = ILL\_ref + delILL,$$

wherein the short circuit current is I_sc;
   wherein the open short circuit voltage is V_oc;
   wherein T is estimated temperature;
   wherein ILL is estimated illumination;
   wherein I_sc_ref, dI_sc/dT, dI_sc/dILL, V_oc_ref, dV_oc/dT, dV_oc/dILL, T_ref and ILL_ref are predetermined constants;

wherein delT is estimated change in temperature with respect to T_ref; and wherein delILL is estimated change in illumination with respect to ILL_ref.

20. The protection apparatus of claim 19 wherein said processor is further structured to estimate the maximum power point from:

$$V\_mpp(T) = V\_mpp\_ref + dV\_oc/dT*$$

$$I\_mpp(ILL) = I\_mpp\_ref + dI\_sc/dILL*$$

wherein V_mpp_ref and I_mpp_ref are predetermined constants;

wherein V_mpp(T) is the voltage component of the estimated maximum power point at the estimated temperature; and wherein I_mpp(T) is the current component of the estimated maximum power point at the estimated temperature.

21. The protection apparatus of claim 20 wherein said processor is further structured to define a valid working region of said photovoltaic module and determine if said sensed current and sensed voltage are within said valid working region.

22. The protection apparatus of claim 21 wherein said valid working region is within a predetermined percentage of said estimated maximum power point.

23. The protection apparatus of claim 22 wherein said predetermined percentage is +/−20%.

24. The protection apparatus of claim 17 wherein said processor is further structured to cause said indicator to indicate at least one of a measured parameter, a detected fault, a diagnostic result, an operating current, an operating voltage, a trip state, a shorted state and an open state.

25. The protection apparatus of claim 17 wherein said processor is further structured to employ said current sensor to measure an operational current, employ said voltage sensor to measure an operational voltage, open said first switch, employ said voltage sensor to measure an open circuit voltage, close said first switch, determine if the operational voltage is less than a first predetermined percentage of the open circuit voltage, determine if the operational current is greater than a second predetermined value, and responsively detect a feed forward fault, employ said indicator to indicate the feed forward fault, and open said first switch.

* * * * *